(12) United States Patent
Ryu et al.

(10) Patent No.: US 9,190,495 B2
(45) Date of Patent: Nov. 17, 2015

(54) RECESSED CHANNEL ARRAY TRANSISTORS, AND SEMICONDUCTOR DEVICES INCLUDING A RECESSED CHANNEL ARRAY TRANSISTOR

(75) Inventors: Jeong-Do Ryu, Gyeonggi-do (KR);
Dong-Chan Kim, Gyeonggi-do (KR);
Seong-Hoon Jeong, Gyeonggi-do (KR);
Si-Young Choi, Gyeonggi-do (KR);
Yu-Gyun Shin, Gyeonggi-do (KR);
Tai-Su Park, Gyeonggi-do (KR);
Jong-Ryeol Yoo, Gyeonggi-do (KR);
Jong-Hoon Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 926 days.

(21) Appl. No.: 12/563,473

(22) Filed: Sep. 21, 2009

(65) Prior Publication Data
US 2010/0072545 A1 Mar. 25, 2010

(30) Foreign Application Priority Data

Sep. 22, 2008 (KR) .................. 10-2008-0092483
May 12, 2009 (KR) .................. 10-2009-0041222

(51) Int. Cl.
*H01L 27/06* (2006.01)
*H01L 29/78* (2006.01)
(Continued)

(52) U.S. Cl.
CPC .... *H01L 29/66795* (2013.01); *H01L 21/28211* (2013.01); *H01L 27/105* (2013.01);
(Continued)

(58) Field of Classification Search
CPC ............ H01L 29/0638; H01L 29/1041; H01L 29/105; H01L 29/42368; H01L 29/4238; H01L 29/7833; H01L 29/7835; H01L 29/4236; H01L 29/51; H01L 21/28211; H01L 29/66795; H01L 21/823412; H01L 27/105; H01L 27/10876; H01L 27/10879; H01L 27/108

USPC .................. 257/334, 330, E29.255, E27.011, 257/E21.41; 438/270

See application file for complete search history.

(56) References Cited

U.S. PATENT DOCUMENTS 5,330,935 A    7/1994   Dobuzinsky et al.
6,930,062 B2   8/2005   Hyun et al.
(Continued)

FOREIGN PATENT DOCUMENTS

CN    1926692 A    3/2007
CN    1956170 A    5/2007
(Continued)

OTHER PUBLICATIONS

Chinese Office Action Corresponding to Chinese Patent Application No. 200910253069.4; Date of Issuance: Dec. 27, 2012; 16 Pages (Foreign Text Only).

Primary Examiner — Lynne Gurley
Assistant Examiner — Naima Kearney
(74) Attorney, Agent, or Firm — Myers Bigel Sibley & Sajovec, P.A.

(57) ABSTRACT

A recessed channel array transistor may include a substrate, a gate oxide layer, a gate electrode and source/drain regions. The substrate may have an active region and an isolation region. A recess may be formed in the active region. The gate oxide layer may be formed on the recess and the substrate. The gate oxide layer may include a first portion on an intersection between a side end of the recess and a sidewall of the active region and a second portion on a side surface of the recess. The first portion may include a thickness greater than about 70% of a thickness of the second portion. The gate electrode may be formed on the gate oxide layer. The source/drain regions may be formed in the substrate. Thus, the recessed channel array transistor may have a decreased leakage current and an increased on-current.

11 Claims, 21 Drawing Sheets

(51) Int. Cl.
*H01L 29/66* (2006.01)
*H01L 21/28* (2006.01)
*H01L 27/105* (2006.01)
*H01L 27/108* (2006.01)
*H01L 27/11* (2006.01)
*H01L 29/423* (2006.01)
*H01L 29/51* (2006.01)
*H01L 21/336* (2006.01)
*H01L 21/8234* (2006.01)

(52) U.S. Cl.
CPC .... *H01L27/10876* (2013.01); *H01L 27/10879* (2013.01); *H01L 27/10894* (2013.01); *H01L 27/11* (2013.01); *H01L 29/4236* (2013.01); *H01L 29/51* (2013.01); *H01L 29/66621* (2013.01); *H01L 29/7851* (2013.01); *H01L 21/823412* (2013.01)

(56) References Cited

U.S. PATENT DOCUMENTS

| | | |
|---|---|---|
| 2007/0042583 A1 | 2/2007 | Jang et al. |
| 2007/0096204 A1 | 5/2007 | Shiratake |
| 2007/0138545 A1* | 6/2007 | Lin et al. ............... 257/330 |
| 2007/0224836 A1 | 9/2007 | Sasaki et al. |
| 2008/0081449 A1* | 4/2008 | Cho et al. ............... 438/589 |
| 2008/0121990 A1* | 5/2008 | Hasunuma ............... 257/333 |

FOREIGN PATENT DOCUMENTS

| | | |
|---|---|---|
| JP | 11-154749 | 6/1999 |
| KR | 10-2005-0065152 A | 6/2005 |
| KR | 10-0472745 | 11/2005 |
| KR | 1020060026836 A | 3/2006 |
| KR | 10-2006-0121066 A | 11/2006 |
| KR | 10-2007-0016419 A | 2/2007 |
| KR | 1020070022325 A | 2/2007 |
| KR | 10-2007-0066485 A | 6/2007 |

* cited by examiner

FIRST REGION | SECOND RGION

FIRST REGION | SECOND RGION

RECESSED CHANNEL ARRAY TRANSISTORS, AND SEMICONDUCTOR DEVICES INCLUDING A RECESSED CHANNEL ARRAY TRANSISTOR

RELATED APPLICATIONS

This application claims priority under 35 USC §119 to Korean Patent Application Nos. 10-2008-0092483, filed on Sep. 22, 2008 and 10-2009-0041222, filed on May 12, 2009 in the Korean Intellectual Property Office (KIPO), the contents of which are herein incorporated by reference in their entirety as if set forth fully herein.

BACKGROUND

Example embodiments relate to recessed channel array transistors, methods of forming recessed channel array transistors, semiconductor devices including recessed channel array transistors, and methods of manufacturing semiconductor devices.

As semiconductor devices may have been highly integrated, a gate length of a MOS transistor may be gradually decreased. Further, in order to improve an operational speed and a current drive capacity of the semiconductor device, a channel length of the semiconductor device may be reduced to deep sub-micron. Therefore, a short channel effect may be frequently generated in the MOS transistor due to a small size of the semiconductor device. This may cause a malfunction of a gate in the MOS transistor.

In order to solve the above-mentioned problems, recessed channel array transistors have been proposed. The recessed channel array transistors may have a long channel length by forming a recessed portion in a channel region of the MOS transistor.

However, in the recessed channel array transistor, a gate insulating layer may be interposed between source/drain regions and a gate electrode. The source/drain regions may have a portion having large area confronting the gate electrode. This may cause a large gate induced leakage current.

Further, an electric field may be concentrated on an edge of the gate electrode. The edge of the gate electrode may function as a parasitic transistor that may cause a double bump where a turn-on may be generated twice.

SUMMARY

Some embodiments of the present invention include a recessed channel array transistor. A transistor may include a substrate having an active region that includes a recess and an isolation region, a gate oxide layer formed on an inner surface of the recess and an upper surface of the substrate, the gate oxide layer including a first portion on an intersection between a side end of the recess and a sidewall of the active region and a second portion on a side surface of the recess. In some embodiments, the first portion may include a thickness greater than about 70% of a thickness of the second portion. A transistor may include a gate electrode formed on the gate oxide layer and in the recess and source/drain regions formed in the upper surface of the substrate at both sides of the gate electrode.

In some embodiments, the isolation region is positioned at both side ends of the recess in a direction that is substantially perpendicular to an extending direction of the active region. Some embodiments provide that a corner between a side upper end of the recess and the sidewall of the active region comprises a rounded shape. In some embodiments, the gate oxide layer includes a third portion on a side upper surface of the recess and a fourth portion on a side lower surface of the recess and the third portion includes a thickness that is greater than that of the fourth portion.

Some embodiments provide that the gate oxide layer includes a gradually decreased thickness from the side upper surface of the recess to the side lower surface of the recess. In some embodiments, a portion of the gate oxide layer on the side edge surface of the recess includes a thickness greater than about 70% of a thickness of a portion of the gate oxide layer on a side central surface of the recess. Some embodiments provide that the recess includes a gradually decreased width in a downward direction.

In some embodiments, the recess includes an upper recess having an upper width and a lower width being in fluidic communication with the upper recess and having a lower width greater than the upper width. Some embodiments provide that the lower recess includes a semi-spherical shape.

Some embodiments of the present invention include methods of manufacturing a recessed channel array transistor. Such methods may include forming a recess in an active region of a substrate that includes an isolation region, forming a gate oxide layer on an inner surface of the recess and an upper surface of the substrate. The gate oxide layer may include a first portion on an intersection between a side end of the recess and a sidewall of the active region and a second portion on a side surface of the recess. The first portion may include a thickness greater than about 70% of a thickness of the second portion. Methods may include forming a gate electrode on the gate oxide layer and in the recess and forming source/drain regions in the upper surface of the substrate at both sides of gate electrode.

In some embodiments, the gate oxide layer includes a third portion on a side upper surface of the recess and a fourth portion on a side lower surface of the recess and the third portion includes a thickness greater than that of the fourth portion. Some embodiments provide that forming the gate oxide layer includes using a plasma oxidation process. In some embodiments, using the plasma oxidation process includes using at least one oxidizing agent selected from the group consisting of $O_2$, NO and/or $N_2O$, and at least one plasma source gas selected from the group consisting of argon, helium and/or xenon. Some embodiments provide that using the plasma oxidation process includes using an electrical neutralized oxidizing agent and/or an electrical ionized oxidizing agent.

In some embodiments, the plasma oxidation process is performed within a range of a normal temperature to about 900° C. Some embodiments provide that the plasma oxidation process is performed under a pressure of about 0.01 Torr to about 50 Torr. In some embodiments, using the plasma oxidation process includes controlling an influx of an oxidizing agent by a depth of the recess to change a thickness of the gate oxide layer. Some embodiments provide that controlling the influx of the oxidizing agent includes controlling by a pressure and/or a bias.

In some embodiments, after forming the gate oxide layer by the plasma oxidation process, methods may include thermally treating the gate oxide layer. Some embodiments provide that forming the recess includes forming an upper recess that has an upper width and forming a lower width that is in fluidic communication with the upper recess and has a lower width greater than the upper width.

Some embodiments of the present invention include semiconductor devices that include a substrate having a first region that has a recess and a second region that has a flat surface. Devices may include a first gate oxide layer formed on an inner surface of the recess and an upper surface of the substrate in the first region. The gate oxide layer may include a first portion on an intersection between a side end of the recess and a sidewall of the first region and a second portion on a side surface of the recess. The first portion may include a thickness greater than about 70% of a thickness of the second portion. A second gate oxide layer may be formed on an upper surface of the substrate in the second region. A first gate electrode may be formed in the recess and first source/drain regions may be formed in the upper surface of the substrate at both sides of the first gate electrode. Some embodiments include a second gate electrode formed on the second gate oxide layer and second source/drain regions formed in the upper surface of the substrate at both sides of the second gate electrode.

In some embodiments, the first gate oxide layer includes a gradually decreased thickness from a side upper surface of the recess to a side lower surface of the recess. Some embodiments provide that the second gate oxide layer includes a thickness different from that of the first gate oxide layer.

Some embodiments of the present invention include methods of manufacturing a semiconductor device. Such methods may include etching a first region of a substrate that has a second region to form a recess, forming a first gate oxide layer on an inner surface of the recess and an upper surface of the substrate in the first region. The gate oxide layer may include a first portion on an intersection between a side end of the recess and a sidewall of the first region and a second portion on a side surface of the recess. The first portion may include a thickness greater than about 70% of a thickness of the second portion. A second gate oxide layer may be formed on an upper surface of the substrate in the second region. A gate electrode layer may be formed on the first gate oxide layer and the second oxide layer and the gate electrode layer may be etched to form a first gate electrode on the first gate oxide layer and a second gate electrode on the second gate oxide layer. Methods may include implanting impurities into the upper surface of the substrate at both sides of the first gate electrode to form first source/drain regions and implanting impurities into the upper surface of the substrate at both sides of the second gate electrode to form second source/drain regions.

In some embodiments, the first gate oxide layer includes a gradually decreased thickness from a side upper surface of the recess to a side lower surface of the recess. Some embodiments provide that the first gate oxide layer is formed by a plasma oxidation process. In some embodiments, forming the second gate oxide layer includes forming a preliminary gate oxide layer on the upper surface of the substrate in the second region by a plasma oxidation process and partially removing the preliminary gate oxide layer to form the second gate oxide layer. Some embodiments provide that the first gate oxide layer and the second gate oxide layer are formed simultaneously with each other by a plasma oxidation process.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DETAILED DESCRIPTION

Figure 1:
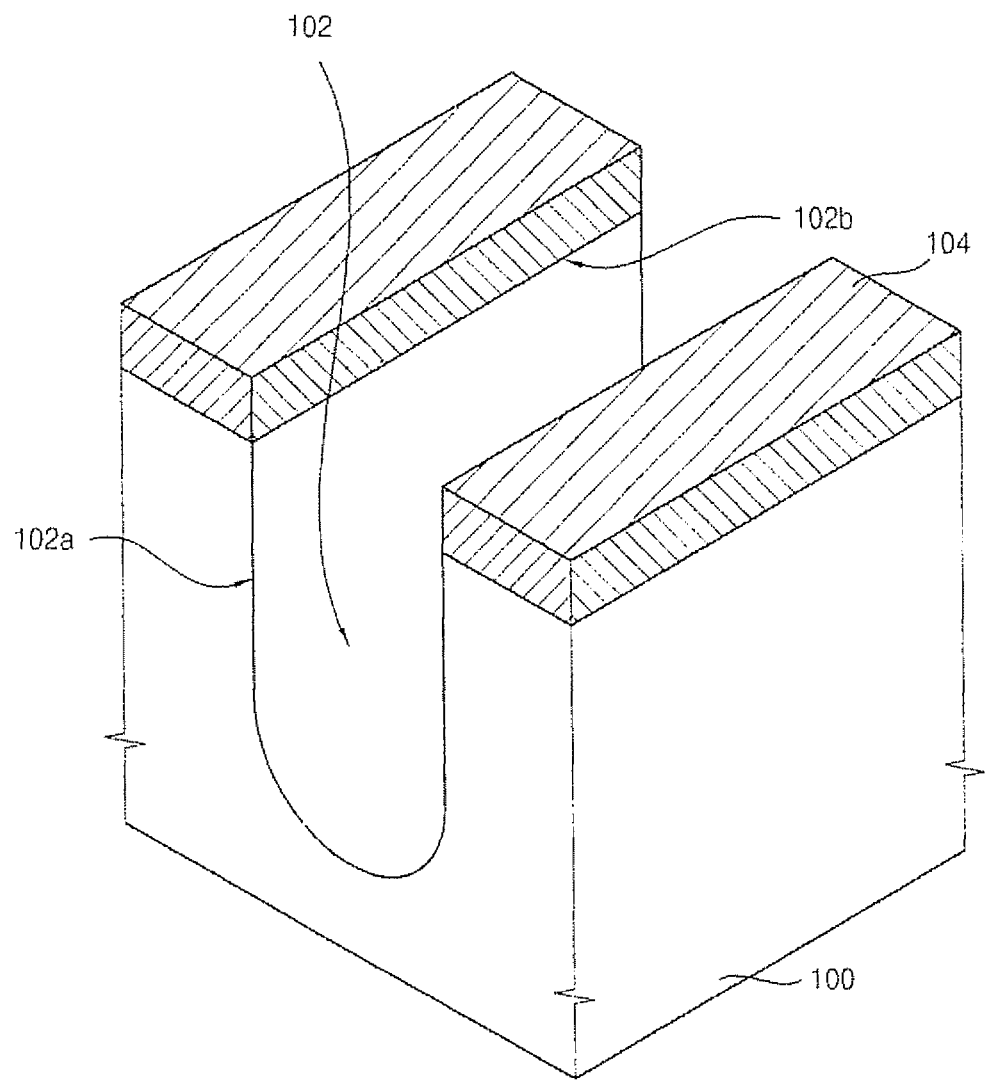
FIGS. 1 and 2 are perspective views illustrating methods of forming an oxide layer in accordance with some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 2:
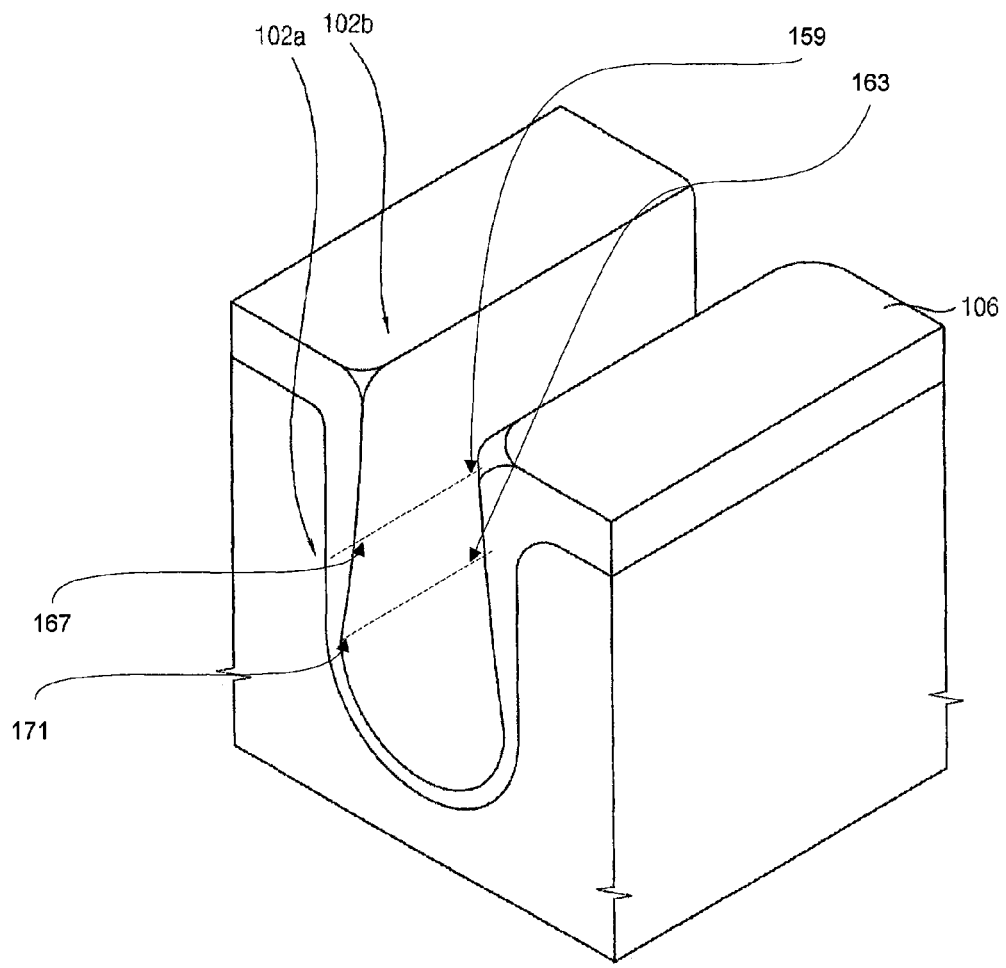

FIGS. 1 and 2 are perspective views illustrating methods of forming an oxide layer in accordance with some embodiments of the present invention. Referring to FIG. 1, a semiconductor substrate 100 may be partially etched to form a recess 102.

In some embodiments, a mask pattern 104 configured to partially expose a region of the semiconductor substrate where the recess 102 may be formed may be formed on the semiconductor substrate 100. The semiconductor substrate 100 may be anisotropically etched using the mask pattern 104 as an etch mask to form the recess 102. The mask pattern 104 may then be removed.

Here, a portion intersected between a side end of the recess 102 and a side surface of the semiconductor substrate 100 may be referred to as a first corner 102a. A portion intersected between an upper end of the recess 102 and an upper surface of the semiconductor substrate 100 may be referred to as a second corner 102b.

Referring to FIG. 2, some embodiments provide that an oxide layer 106 may be formed on the upper surface of the semiconductor substrate 100 and an inner surface of the recess 102 by a plasma oxidation process.

In some embodiments, portions of the oxide layer 106 on the first corner 102a and the second corner 102b formed by the plasma oxidation process may have a thickness substantially the same as or greater than that of a portion of the oxide layer 106 on a bottom surface of the recess 102.

The thickness profile of the oxide layer 106 may be caused by concentrating plasma ions on the first corner 102a and the second corner 102b and increasing an influx of an oxidizing agent. Further, the portion of the oxide layer 106 on the second corner 102b may have a rounded shape. Thus, some embodiments provide that a sharp end may not be generated at an intersection portion of the oxide layer 106 between the first corner 102a and the second corner 102b.

The thickness of the oxide layer 106 on the first corner 102a may be greater than about 70% of that of the oxide layer 106 on the side surface of the recess 102. That is, a thickness difference between the portion of the oxide layer 106 on the first corner 102a and the portion of the oxide layer 106 on the side surface of the recess 102 may not be large. In some embodiments, the thickness of the oxide layer 106 on the first corner 102a may be greater than that of the oxide layer 106 on the side surface of the recess 102.

In contrast, according to a conventional method of forming an oxide layer by a thermal oxidation process, an oxidation reaction at the first corner 102a and the second corner 102b may become diminished due to stresses on the first corner 102a and the second corner 102b. Particularly, the oxidation reaction at the first corner 102a may become more diminished, so that a thickness difference between the portion of the oxide layer 106 on the first corner 102a and the portion of the oxide layer 106 on the side surface of the recess 102 may be very large. That is, the portion of the oxide layer 106 on the first corner 102a, which may be formed by the thermal oxidation process, may have a very thin thickness. Further, the oxidation reaction may almost not be generated at the first corner 102a, so that a sharp end may be generated at the first corner 102a. Because an electric field may be concentrated on the sharp end in an edge of an active region, a leakage current may be increased due to the sharp end. However, according to some embodiments, the sharp end may not be generated or a sharpness of the sharp end may be smoothed. Therefore, a leakage current of a recessed channel array transistor may be reduced.

Further, the oxide layer 106 may have a gradually decreased thickness from a side upper portion of the recess 102 to a side lower portion of the recess 102. This may be caused by a flux difference of the oxidizing agent in the recess 102 during the plasma oxidation process. Particularly, the flux of the oxidizing agent in an upper space of the recess 102 may be higher than that in a lower space of the recess 102.

Figure 3:
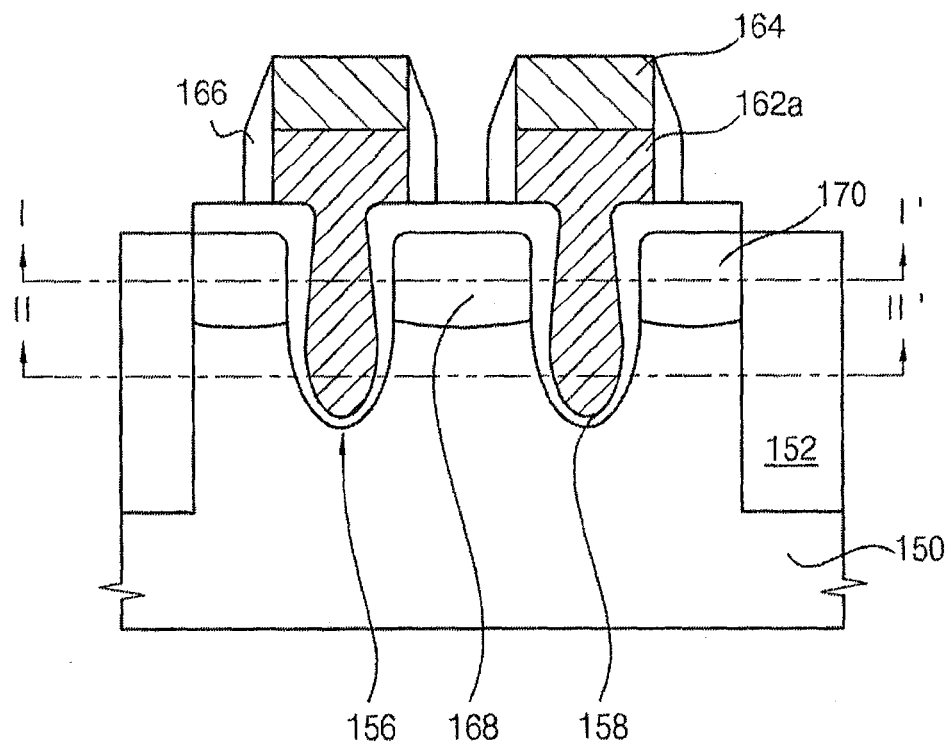
FIG. 3 is a cross-sectional view illustrating a recessed channel array transistor including the insulating layer in FIG. 1.
Figure 4:
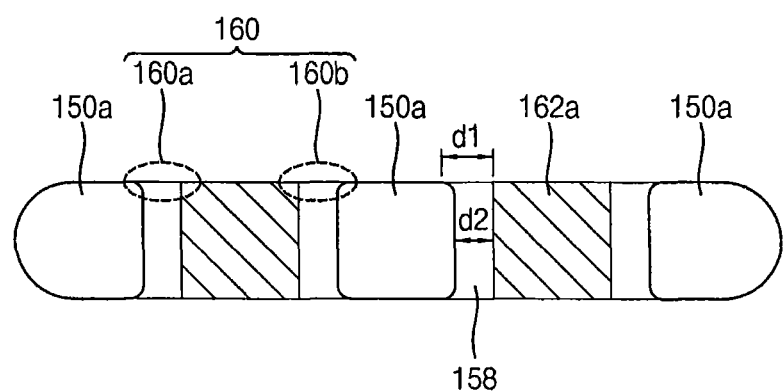
FIG. 4 is a cross-sectional view taken along a line I-I' in FIG. 3.
Figure 5:
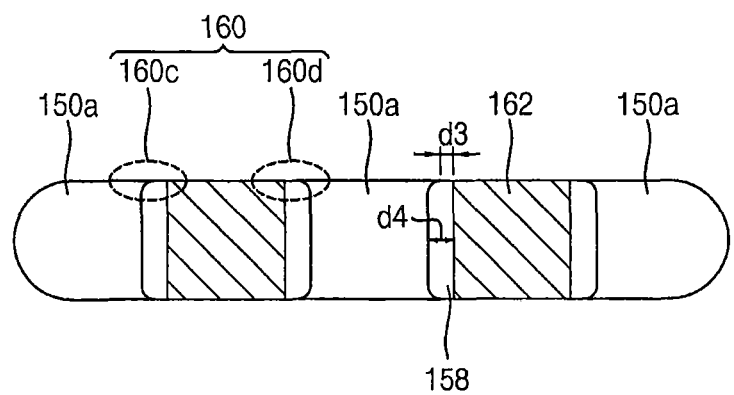
FIG. 5 is a cross-sectional view taken along a line in FIG. 3.

FIG. 3 is a cross-sectional view illustrating a recessed channel array transistor including the insulating layer in FIG. 1. FIG. 4 is a cross-sectional view taken along a line I-I' in FIG. 3, and FIG. 5 is a cross-sectional view taken along a line in FIG. 3. As illustrated, the transistor in FIG. 3 may include the oxide layer in FIG. 1.

Referring to FIGS. 3 through 5, a semiconductor substrate 150 may be prepared. In some embodiments, the semiconductor substrate 150 may include single crystalline silicon. An isolation layer pattern 152 may be formed in the semiconductor substrate 150. The isolation layer pattern 152 may define an active region 150a and an isolation region of the semiconductor substrate 150. The active region 150a may have an isolated island shape. The isolation layer pattern 152 may be configured to surround the active region 150a. The isolation layer pattern 152 may be formed by a shallow trench isolation process.

Some embodiments provide that a recess 156 may be formed at an upper surface of the semiconductor substrate 150 in the active region 150a. In some embodiments, the recess 156 may have a shape crossing over the active region 150a. Thus, the recess 156 may have a first side surface, a second side surface, a third side surface and/or a fourth side surface. The first side surface may confront the second side surface. The third side surface may confront the fourth side surface. Therefore, the first side surface and the second side surface may be substantially perpendicular to the third side surface and the fourth side surface. The semiconductor substrate 150 may be exposed through the first side surface and the second side surface. Further, the isolation layer pattern 152 may be exposed through the third side surface and the fourth side surface. The recess 156 may have a gradually decreased width along a downward direction.

The recess 156 may have a first corner 160 and a second corner. The first corner 160 may correspond to an intersection between a side edge of the recess 156, a sidewall of the active region 150a and the isolation layer pattern 152. The second corner may correspond to an intersection between an upper end of the recess 156 and an upper surface of the semiconductor substrate 150.

In some embodiments, an extending direction of the active region 150a may be substantially perpendicular to that of the recess 156. In contrast, as shown in FIGS. 4 and 5, some embodiments provide that the extending direction of the active region 150a may be inclined to the extending direction of the recess 156.

Referring to FIG. 4, the first corner 160 may have first upper corners 160a and 160b where a side upper portion of the recess 156 and the sidewall of the active region 150a may be intersected with each other. The first upper corners 160a and 160b may have a rounded shape.

Because the first upper corners 160a and 160b may have the rounded shape without a sharp portion, an electric field may not be concentrated on the first upper corners 160a and 160b. Particularly, when the recess 156 may be inclined to the active region 150a, the electric field concentration on the first upper corners 160a and 160b may be more reduced.

In contrast, referring to FIG. 5, the first corner may also have first lower corners 160c and 160d where a side lower portion of the recess 156 and the sidewall of the active region 150a may be intersected with each other. Although the first lower corners 160c and 160d may have a sharper shape than the first upper corners 160a and 160b, the first lower corners 160c and 160d in the recessed channel array transistor of some embodiments may have sharpness that is relatively less than that of first lower corners in conventional recessed channel array transistors.

As described herein, recessed channel array transistors including cross-sectional views as illustrated in FIGS. 4 and 5 may be obtained by lapping an upper surface of the recessed channel array transistor to a level corresponding to I-I' and II-II' and observing an upper surface of the lapped recess channel array transistor using an SEM or a TEM.

Referring to FIGS. 3 to 5, a gate oxide layer 158 may be formed on the upper surface of the semiconductor substrate 150 and an inner surface of the recess 156. In some embodiments, the gate oxide layer 158 may have a first portion (FIG. 2, 167) on the first upper corners 160a and 160b, and a second portion (FIG. 2, 159) on the side central surface of the recess 156. The first portion may have a thickness greater than about 70% of a thickness of the second portion. Particularly, the thickness of the first portion 167 may be about 70% to about 130% of the thickness of the second portion 159 at the same height.

Referring to FIG. 4, the thickness d1 of the first portion of the gate oxide layer 158 on the first upper corners 160a and 160b may be substantially the same as or greater than the thickness d2 of the second portion of the gate oxide layer 158 on the side surface of the recess 156.

In some embodiments, the thickness d1 of the first portion of the gate oxide layer 158 on the first upper corners 160a and 160b may be about 70% to about 130% of the thickness d2 of the second portion of the gate oxide layer 158 on the side surface of the recess 156.

Referring to FIG. 5, the gate oxide layer 158 may further have a third portion (FIG. 2, 171) on the first lower corners 160c and 160d and a fourth portion (FIG. 2, 163) on the side surface of the recess 156. A thickness d3 of the third portion 171 of the gate oxide layer 158 on the first lower corners 160c and 160d may be about 70% to about 130% of the thickness d4 of the fourth portion 163 of the gate oxide layer 158 on the side surface of the recess 156.

Here, the lower space and the upper space of the recess 156 may be divided by a horizontal plane on a half height of the recess 156 measured from a bottom surface of the recess 156.

That is, as shown in FIGS. 4 and 5, the first portion of the gate oxide layer 158 on the first upper corners 160a and 160b may have the thickness greater than about 70% of the thickness of the second portion of the gate oxide layer 158 on the side surface of the recess 156.

Further, the first portion of the gate oxide layer 158 on the first upper corners 160a and the 160b may have a gradually decreased thickness along the downward direction. Particularly, a thickness difference between the first portion on the first upper corners 160a and 160b and the second portion on the side surface of the recess 156 may become larger along the downward direction.

However, in the recessed channel array transistor of some embodiments, the thickness of the first portion on the first upper corners 160a and 160b may be greater than about 70% of the thickness of the second portion on the side surface of the recess 156. That is, the thickness difference between the first portion on the first upper corners 160a and 160b and the second portion on the side surface of the recess 156 may be within about 30% of the thickness of the second portion.

Therefore, the first portion of the gate oxide layer 158 on the first upper corners 160a and 160b may not have a very thin thickness, so that the electric field may not be concentrated on the first upper corners 160a and 160b. As a result, malfunctions of the recessed channel array transistor of embodiments described herein may be reduced.

Further, the gate oxide layer 158 on the side upper surface of the recess 156 may have a thickness greater than that of the gate oxide layer on the side lower surface of the recess 156. In some embodiments, the gate oxide layer 158 may have the gradually decreased thickness along the downward direction.

A gate electrode 162a may be formed on the gate oxide layer 158 in the recess 156. In some embodiments, the gate electrode 162a may have a protrusion protruded from the upper surface of the semiconductor substrate 150. A hard mask pattern 164 may be formed on the gate electrode 162a.

Spacers 166 may be formed on a sidewall of the protrusion of the gate electrode 162a. Source/drain regions 168 and 170 may be formed in the semiconductor substrate 150 at both sides of the gate electrode 162a.

According to some embodiments, the gate oxide layer 158 may have the gradually decreased thickness from the side upper surface of the recess 156 to the side lower surface of the recess 156. Thus, the thickness of the gate oxide layer 158 between the source/drain regions 168 and 170 and the gate electrode 162a may be greater than that of the gate oxide layer 158 on a channel region of the recessed channel array transistor. Therefore, a gate induced drain leakage current may be remarkably reduced, so that the recessed channel array transistor may have improved operational characteristics. Moreover, the gate oxide layer 158 on the channel region may have a relatively thin thickness, so that the recessed channel array transistor may have a rapid on-current. As a result, the recessed channel array transistor may have a rapid operational speed.

Figure 6:
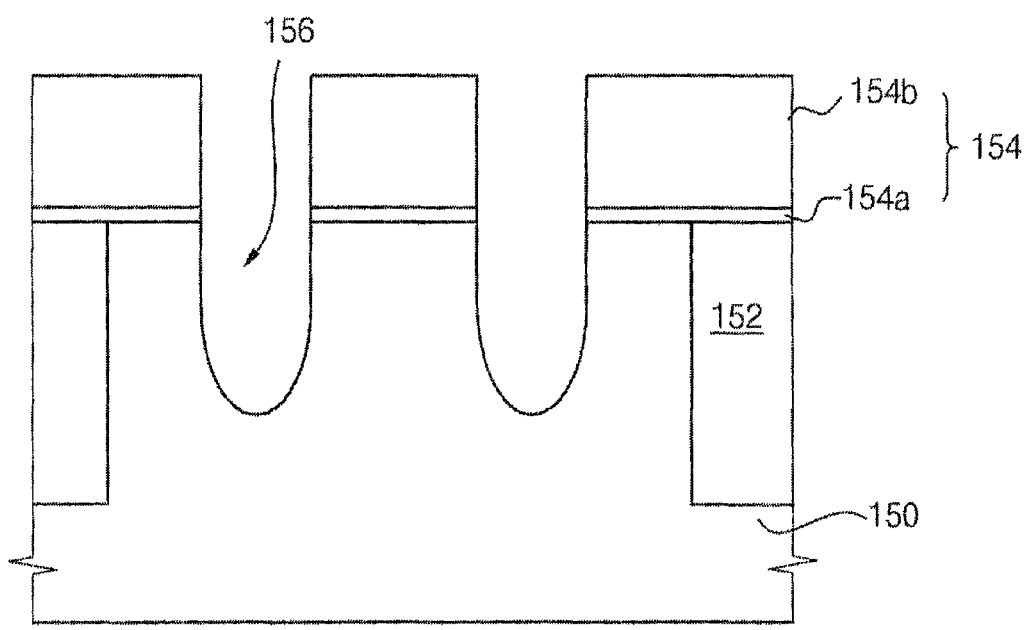
FIGS. 6, 7 and 10 are cross-sectional views illustrating methods of forming the recessed channel array transistor in FIG. 3.
Figure 7:
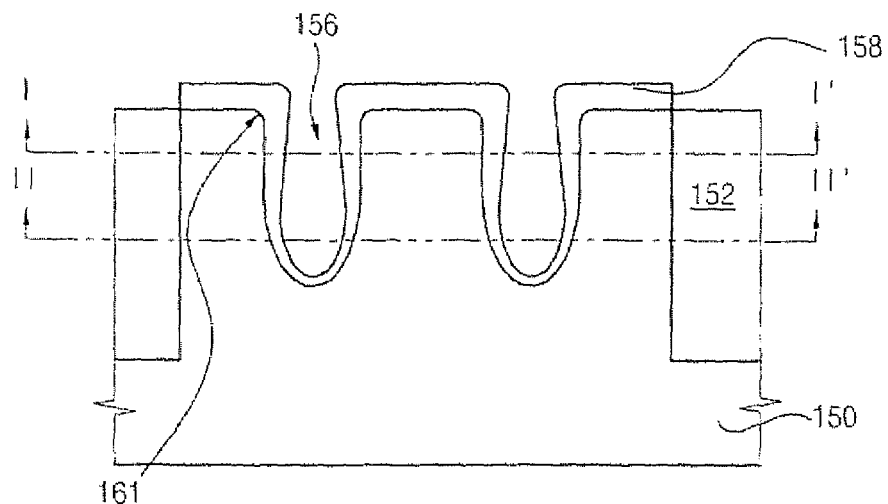
Figure 8:
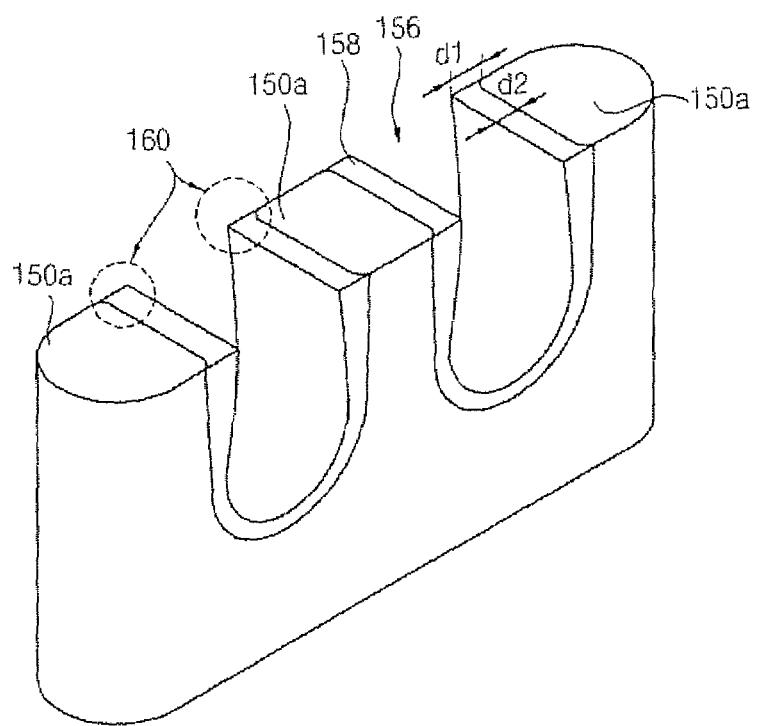
FIG. 8 is a perspective view taken along a line I-I' in FIG. 7.
Figure 9:
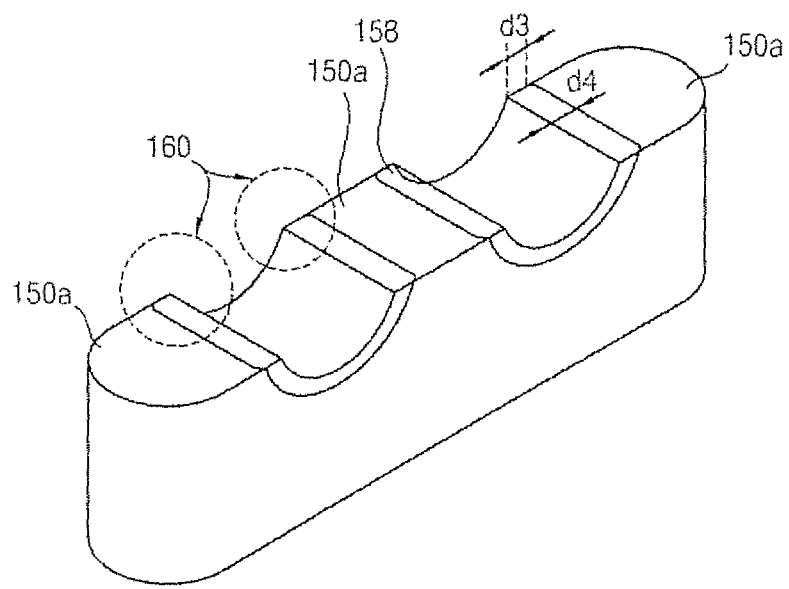
FIG. 9 is a perspective view taken along a line II-II' in FIG. 7.
Figure 10:
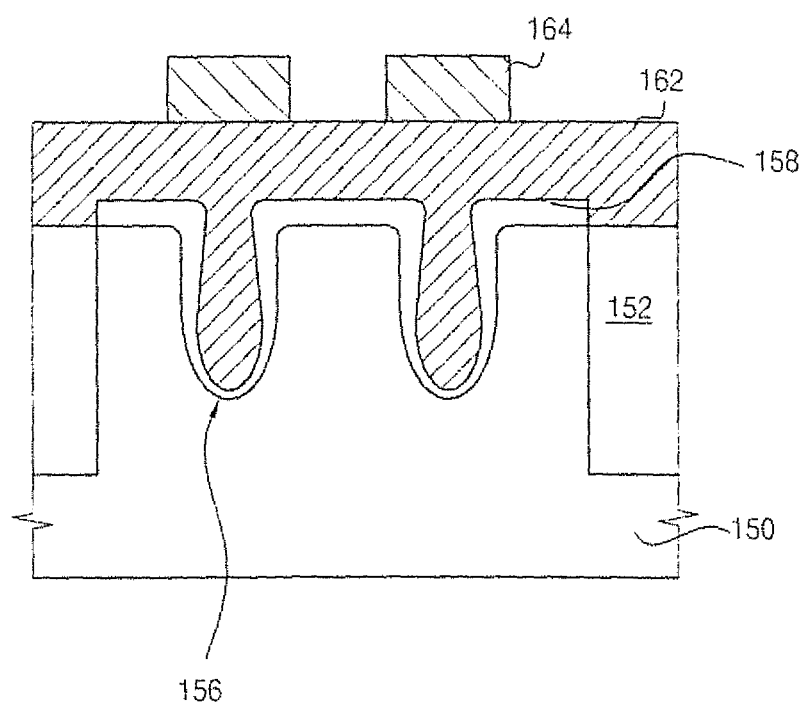

FIGS. 6, 7 and 10 are cross-sectional views illustrating methods of forming the recessed channel array transistor in FIG. 3. FIG. 8 is a perspective view taken along a line I-I' in FIG. 7 and FIG. 9 is a perspective view taken along a line II-II' in FIG. 7.

Referring to FIG. 6, a shallow trench isolation process may be performed on a semiconductor substrate 150 to form an isolation layer pattern 152, thereby defining an active region 150a and an isolation region of the semiconductor substrate 150. In some embodiments, the active region 150a may have an isolated island shape. The isolation layer pattern 152 may be configured to surround the active region 150a.

A mask pattern 154 configured to expose a region of the semiconductor substrate 150 where a recess may be formed may be formed on the active region 150a of the semiconductor substrate 150 and the isolation layer pattern 152. In some embodiments, the mask pattern 154 may include a pad oxide layer pattern 154a and a silicon nitride layer pattern 154b formed on the pad oxide layer pattern 154a. The exposed region of the semiconductor substrate 150 through the mask pattern 154 may have a linear shape crossing over the active region 150a.

The active region 150a of the semiconductor substrate 150 may be anisotropically etched using the mask pattern 154 as an etch mask to form the recess 156. In some embodiments, the recess 156 may be formed by a reactive ion etching process using an etching gas that may include chlorine (Cl). After forming the recess 156, a cleaning process may be additionally performed to remove byproducts generated in the reactive ion etching process.

In some embodiments, the recess 156 may have both side surfaces arranged in a direction substantially perpendicular to an extending direction of a channel. The isolation layer pattern 152 may be exposed through the side surfaces of the recess 156. That is, the recess 156 may be arranged in the direction substantially perpendicular to the extending direction of the channel.

Although not depicted in drawings, after forming the recess 156, the mask pattern 154 may then be removed.

Referring to FIGS. 7 to 9, a plasma oxidation process may be performed on an upper surface of the semiconductor substrate 150 and an inner surface of the recess 156 to form a gate oxide layer 158.

In some embodiments, the plasma oxidation process may use an oxidizing agent including $O_2$, NO, and/or $N_2O$, among others. These may be used alone or in a combination thereof. Further, the plasma oxidation process may use a source gas for generating plasma including argon, helium, and/or xenon, among others. These may be used alone or in a combination thereof.

In some embodiments, the oxidizing agent used in the plasma oxidation process may be electrical neutrality and/or an electrical ion.

In some embodiments, the plasma oxidation process may allow an oxidation reaction at a temperature relatively lower than that of a thermal oxidation process. For example, the plasma oxidation process may oxidize silicon at a temperature of a normal temperature to about 900° C., and/or about 650° C. to about 800° C.

In some embodiments, the plasma oxidation process may be performed under a pressure of about 0.01 Torr to about 50 Torr, and/or about 0.5 Torr to about 5 Torr. The pressure may control an influx of the oxidizing agent introduced into the recess 156. Particularly, the influx of the oxidizing agent introduced into a lower space of the recess 156 may be reduced in proportional to the pressure drop in the plasma oxidation process.

In some embodiments, the influx of the oxidizing agent in accordance with a depth of the recess 156 may be controlled by applying a bias during the plasma oxidation process. When the bias may be applied, the influx of the oxidizing agent introduced into the lower space of the recess 156 may be increased.

In some embodiments, corners of the recess 156 may have a rounded shape by the oxidation reaction. Further, the gate oxide layer 158 may have a variable thickness by positions.

Referring to FIG. 8, the gate oxide layer 158 may have a first portion on first upper corners, and a second portion on the side surface of the recess 156. The first portion may have a thickness d1 greater than about 70% of a thickness d2 of the second portion. Particularly, the thickness d1 of the first portion of the gate oxide layer 158 on the first upper corners may be greater than the thickness d2 of the second portion of the gate oxide layer 158 on the side surface of the recess 156.

Referring to FIG. 9, the gate oxide layer 158 may further have a third portion on the first lower corners and a fourth portion on the side surface of the recess 156. A thickness d3 of the first portion of the gate oxide layer 158 on the first lower corners may be greater than about 70% of the thickness d4 of the fourth portion of the gate oxide layer 158 on the side surface of the recess 156.

That is, as shown in FIGS. 8 and 9, the thickness of the gate oxide layer 158 on the edge of the recess 156 may be greater than about 70% of the thickness of the gate oxide layer 158 on the central portion of the recess 156.

That is, the thickness difference between the first portion on the first upper corners and the second portion on the side surface of the recess 156 may be within about 30% of the thickness of the second portion regardless of horizontal measuring points. Particularly, the thickness difference between the first portion and the second portion of the gate oxide layer 158 in the lower space of the recess 156 may become large. In contrast, according to some embodiments, as mentioned above, the thickness difference between the first portion on the first upper corners and the second portion on the side surface of the recess 156 may be within about 30% of the thickness of the second portion. Thus, a portion of the gate oxide layer 158 on the first corner 160 may have low sharpness.

In some embodiments, the gate oxide layer 158 may have a gradually decreased thickness along the downward direction. As mentioned above, the influx of the oxidizing agent introduced into the recess 156 may be controlled in accordance with the pressure and the bias. Therefore, the gate oxide layer 158 may be provided with a large thickness difference or a small thickness difference by the depth of the recess 156 by changing the pressure and the bias in the plasma oxidation process. For example, the gate oxide layer 158 may be provided with the large thickness difference by the depth of the recess 156 by lowering the pressure or decreasing the bias.

Although not depicted in drawings, after forming the gate oxide layer 158 by the plasma oxidation process, a thermal treatment process may be additionally performed. In some embodiments, the thermal treatment process may be performed at a temperature greater than that of the plasma oxidation process. For example, the thermal treatment process may be performed at a temperature of about 800° C. to about 950° C. After performing the thermal treatment process, a thermal oxide layer may be formed on the gate oxide layer 158.

Referring to FIG. 10, a gate conductive layer 162 may be formed on the gate oxide layer 158 and the semiconductor substrate 150. In some embodiments, the gate conductive layer 162 may include, for example, polysilicon having good step coverage. For example, the gate conductive layer 162 may be formed using an SiH$_4$ gas and a PH$_3$ gas at a temperature of about 450° C. to about 550° C. The recess 156 may be filled with the gate conductive layer 162.

A hard mask pattern 164 may be formed on the gate conductive layer 162. The hard mask pattern 164 may be configured to cover the recess 156.

Referring to FIG. 3, the gate conductive layer 162 may be etched using the hard mask pattern 164 as an etch mask to form a gate electrode 162a.

A spacer layer (not shown) may be formed on the gate electrode 162a and the semiconductor substrate 150. The spacer layer may be anisotropically etched to form a spacer 166 on a sidewall of the gate electrode 162a. In some embodiments, the process for forming the spacer 166 may be omitted for simplifying the methods described herein.

Some embodiments provide that impurities may be implanted into the semiconductor substrate 150 at both sides of the gate electrode 162a to form source/drain regions 168 and 170.

Figure 11:
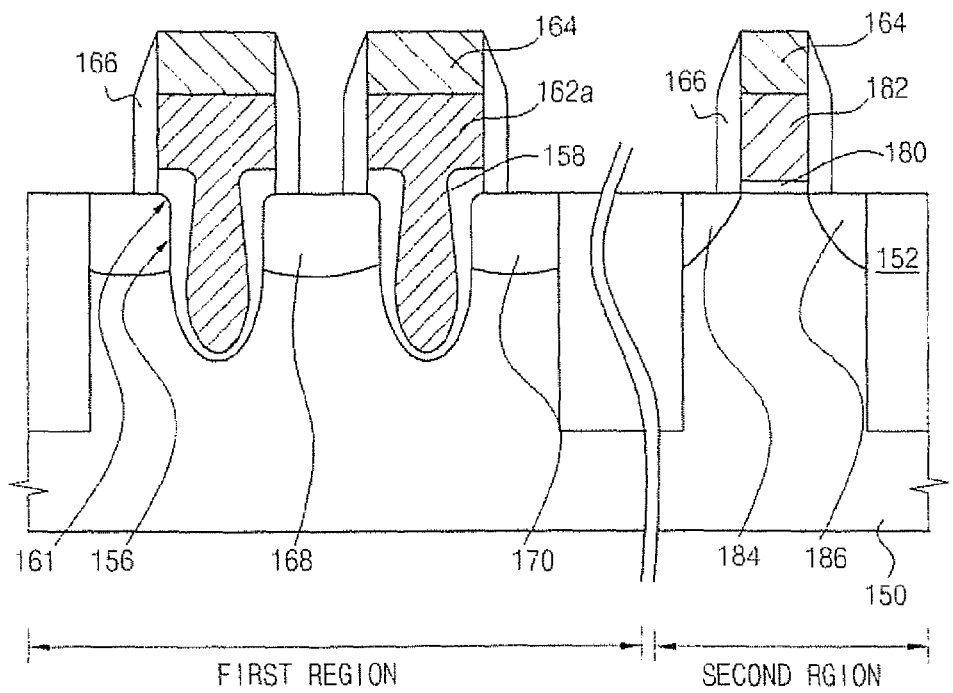
FIG. 11 is a cross-sectional view illustrating a semiconductor device including the recessed channel array transistor in FIG. 3.

FIG. 11 is a cross-sectional view illustrating a semiconductor device including the recessed channel array transistor in FIG. 3. Here, the semiconductor device in FIG. 11 may include a planar transistor. A semiconductor substrate 150 may have a first region and a second region. In some embodiments, the semiconductor substrate 150 may include single crystalline silicon. The first region may correspond to a memory cell region where memory cells may be formed. The second region may correspond to a peripheral circuit region where peripheral circuits may be formed.

A recessed channel array transistor substantially the same as that in FIG. 3 may be formed in the first region of the semiconductor substrate 150.

The recessed channel array transistor may include a first gate oxide layer 158 in a recess 156. The first gate oxide layer 158 may have a gradually decreased thickness from a side upper surface of the recess 156 to a side lower surface of the recess 156. A first portion of the first gate oxide layer 158 on a first corner where the side surface of the recess 156 and a side surface of the active region, i.e., the first region may be intersected with each other may have a thickness greater than about 70% of the thickness of a second portion of the first gate oxide layer 158 on the side surface of the recess 156.

The planar transistor may be formed in the second region of the semiconductor substrate 150. The planar transistor may include a second gate oxide layer 180. In some embodiments, the second gate oxide layer 180 may have a thickness less than that of the first gate oxide layer 158.

A second gate electrode 182 and a hard mask pattern 164 may be sequentially formed on the second gate oxide layer 180. A spacer 166 may be formed on a sidewall of the second gate electrode 182.

Second source/drain regions 184 and 186 may be formed in an upper surface of the semiconductor substrate 150 at both sides of the second gate electrode 182.

According to some embodiments, the second gate oxide layer 180 of the planar transistor in the peripheral circuit region may have the thickness less than that of the first gate oxide layer 150 on the first region of the semiconductor substrate 150. Thus, the planar transistor may have an increased on-current and a rapid operational speed.

Figure 12:
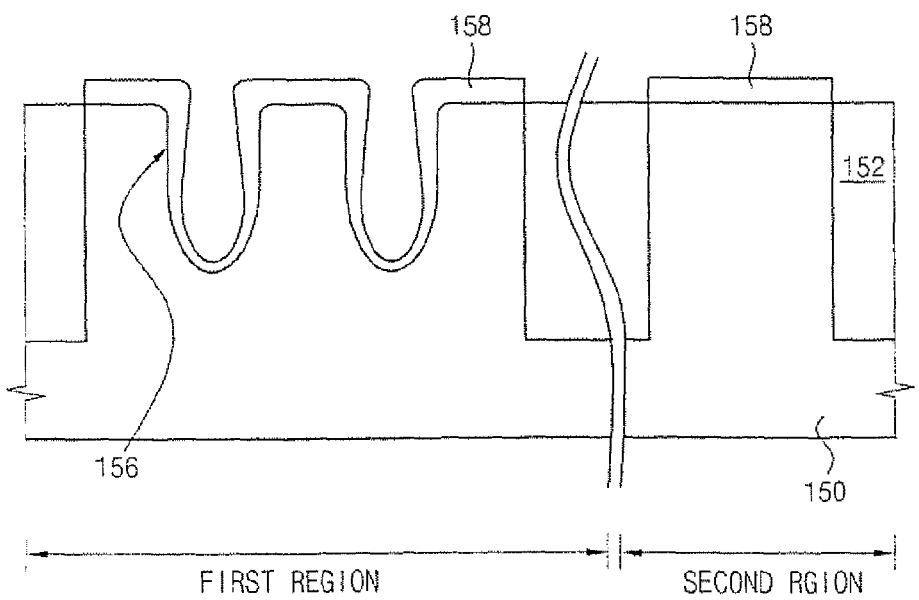
FIGS. 12 to 14 are cross-sectional views illustrating methods of manufacturing the semiconductor device in FIG. 11.
Figure 13:
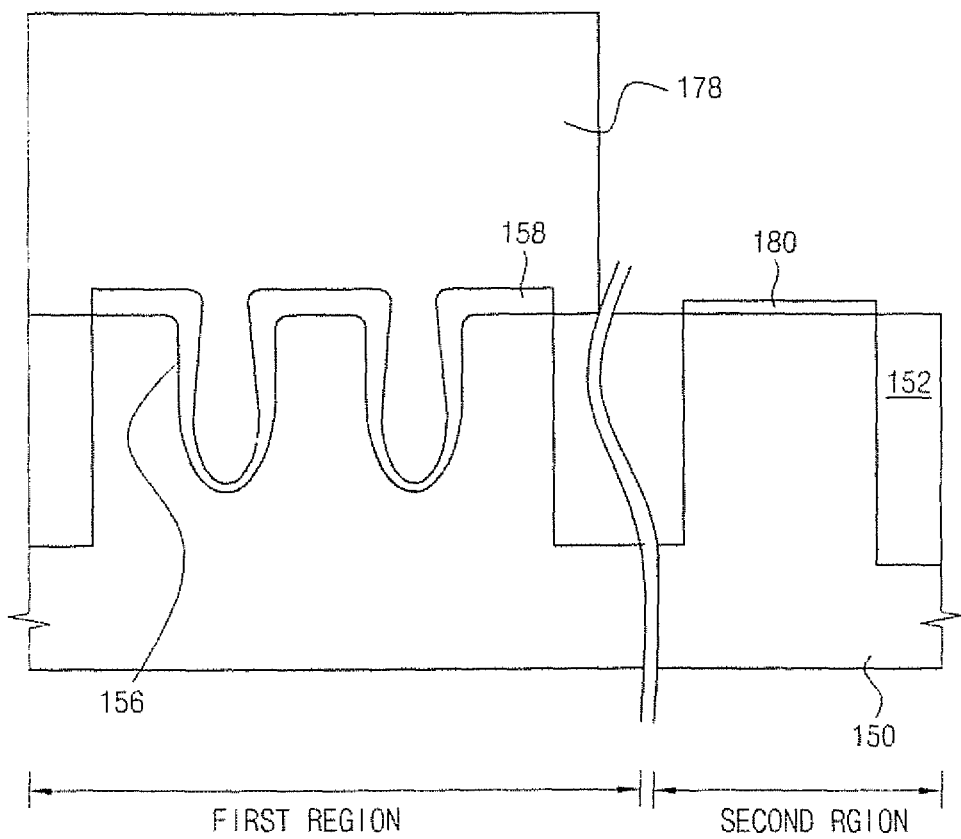
Figure 14:
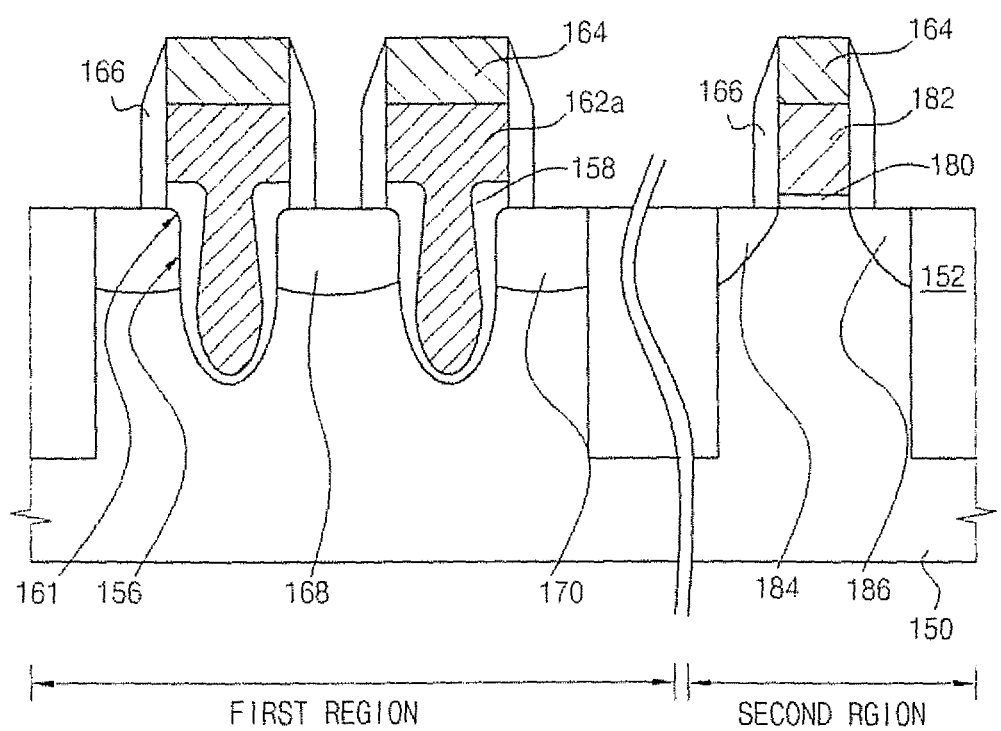

FIGS. 12 to 14 are cross-sectional views illustrating methods of manufacturing the semiconductor device in FIG. 11.

Referring to FIG. 12, a shallow trench isolation process may be performed on a semiconductor substrate 150 having a first region and a second region to form an isolation layer pattern 152, thereby defining an active region and an isolation region of the semiconductor substrate 150. In some embodiments, the active region in the first region may have an isolated island shape. The isolation layer pattern 152 may be configured to surround the active region.

The active region in the first region may be partially etched to form a recess 156. Here, the process for forming the recess 156 may be substantially the same as that described above and illustrated with reference to FIG. 6.

A first gate oxide layer 158 may be formed on the recess 156 and the semiconductor substrate 150 by a plasma oxidation process. Here, the process for forming the first gate oxide layer 158 may be substantially the same as that illustrated with reference to FIGS. 7 to 9.

Referring to FIG. 13, a photoresist film (not shown) may be formed on the semiconductor substrate 150 and the first gate oxide layer 158. The photoresist film may be patterned by a photolithography process to form a photoresist pattern 178 configured to covering the first region of the semiconductor substrate 150. Thus, the first gate oxide layer 158 on the second region of the semiconductor substrate 150 may be exposed through the photoresist pattern 178.

The first gate oxide layer 178 on the second region of the semiconductor substrate 150 may be partially etched to form a second gate oxide layer 180. In some example embodiments, the second gate oxide layer 180 may have a thickness less than that of the first gate oxide layer 178. The photoresist pattern 178 may then be removed by an ashing process and/or a stripping process, among others.

Referring to FIG. 14, a gate conductive layer (not shown) may be formed on the first gate oxide layer 178 and the second gate oxide layer 180. In some embodiments, the gate conductive layer may be formed on the semiconductor substrate 150 to fill up the recess 156. Some embodiments provide that an upper surface of the gate conductive layer may be planarized by a CMP process and/or an etch-back process.

A hard mask pattern 164 may be formed on the gate conductive layer. The gate conductive layer may be etched using the hard mask pattern 164 as an etch mask to form a first gate electrode 162a in the first region and a second gate electrode 182 in the second region. Spacers 166 may be formed on sidewalls of the first gate electrode 162a and the second gate electrode 182, respectively.

Impurities may be implanted into the semiconductor substrate 150 at both sides of the first gate electrode 162a and the second gate electrode 182, respectively, to form first source/drain regions 168 and 170 and second source/drain regions 184 and 186.

In some embodiments, the first source/drain regions 168 and 170 and the second source/drain regions 184 and 186 may be formed by substantially the same impurity ion implantation process. In some embodiments, the first source/drain regions 168 and 170 and the second source/drain regions 184 and 186 may be formed by different impurity ion implantation processes.

Particularly, a first ion implantation mask may be formed on the semiconductor substrate 150 to expose the first region of the semiconductor substrate 150. Impurities may be implanted into the semiconductor substrate 150 using the first ion implantation mask to form the first source/drain regions 168 and 170. A second ion implantation mask may be formed on the semiconductor substrate 150 to expose the second region of the semiconductor substrate 150. Impurities may be implanted into the semiconductor substrate 150 using the second ion implantation mask to form the second source/drain regions 184 and 186.

Figure 15:
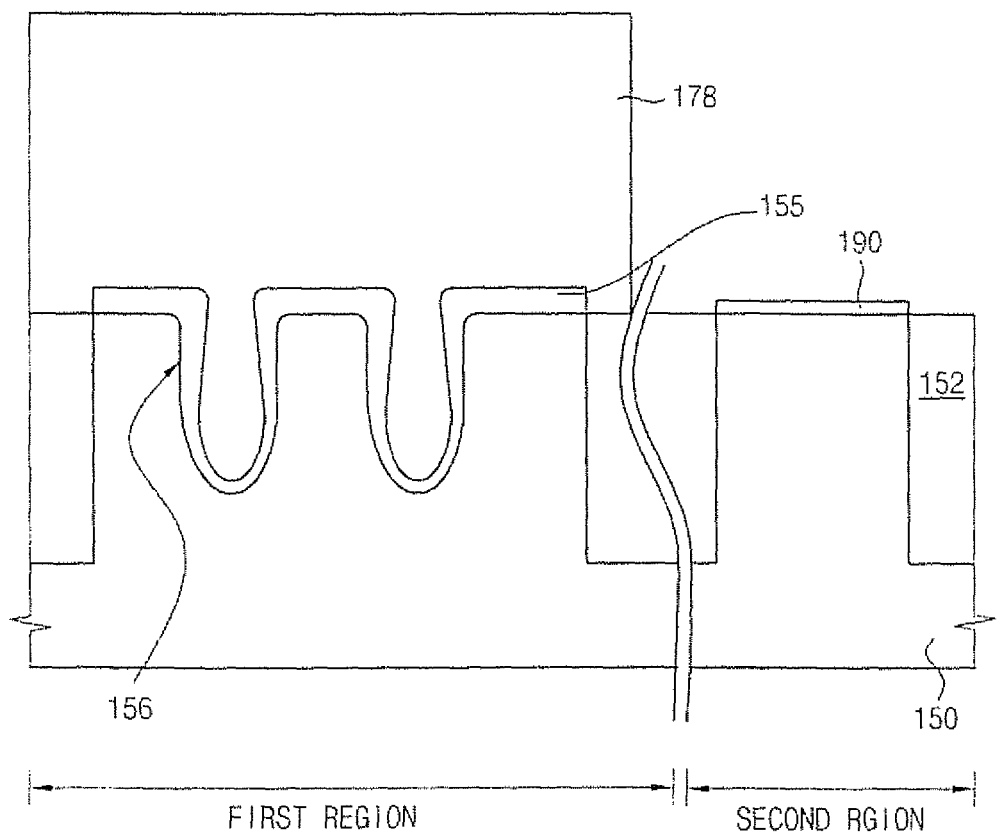
FIGS. 15 to 17 are cross-sectional views illustrating methods of manufacturing the semiconductor device in FIG. 11 in accordance with some embodiments of the present invention.
Figure 16:
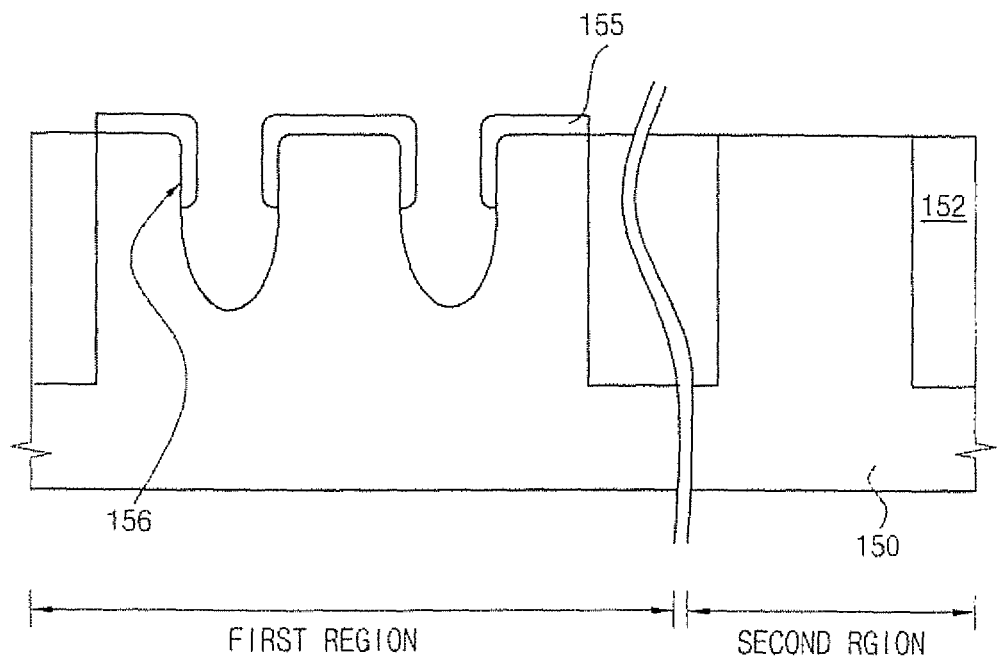
Figure 17:
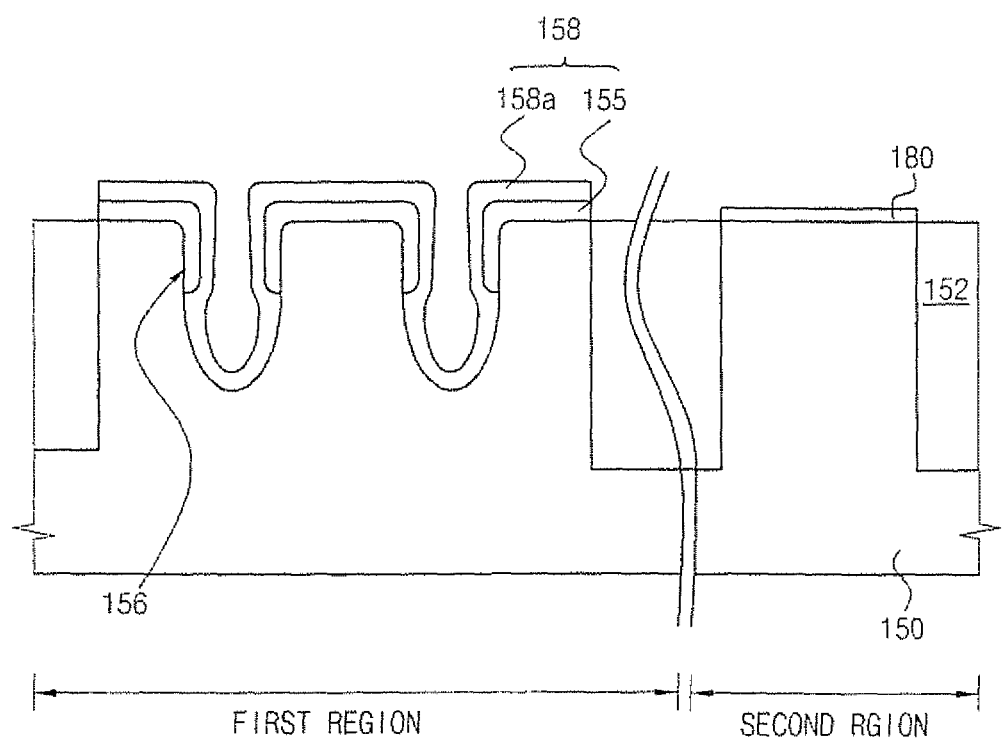

FIGS. 15 to 17 are cross-sectional views illustrating methods of manufacturing the semiconductor device in FIG. 11 in accordance with some embodiments of the present invention.

Here, method of these embodiments may be substantially similar as those with reference to FIGS. 12 to 14 except for a process for forming a gate oxide layer. Thus, any further illustrations with respect to the same processes are omitted herein for brevity.

Referring to FIG. 15, an isolation layer pattern 152 may be formed in a semiconductor substrate 150 having a first region and a second region. The first region of the semiconductor substrate 150 may be partially etched to form a recess 156.

A plasma oxidation process may be performed on the semiconductor substrate 150 to form a first preliminary gate oxide layer 155 on an upper surface of the semiconductor substrate 150 and an inner surface of the recess 156. In some embodiments, the first preliminary gate oxide layer 155 may have a gradually decreased thickness from a side upper surface of the recess 156 to a side lower surface of the recess 156. A first portion of the first preliminary gate oxide layer 155 on a first corner where a side edge of the recess 156 and a sidewall of the active region may be intersected with each other may have a thickness greater than about 70% of a thickness of a second portion of the first preliminary gate oxide layer 155 on a side surface of the recess 156.

Here, the process for forming the first preliminary gate oxide layer 155 may be substantially the same as that illustrated with reference to FIGS. 7 to 9.

A photoresist film (not shown) may be formed on the semiconductor substrate 150 and the first preliminary gate oxide layer 155. The photoresist film may be patterned by a photolithography process to form a photoresist pattern 178 configured to expose the first preliminary gate oxide layer 155 in the second region of the semiconductor substrate 150.

The first preliminary gate oxide layer 155 in the second region of the semiconductor substrate 150 may be partially etched using the photoresist pattern 179 as an etch mask to form a second preliminary gate oxide layer 190 having a thickness less than that of the first preliminary gate oxide layer 155. In some embodiments, the first preliminary gate oxide layer 155 in the second region of the semiconductor substrate 150 may be completely removed. The photoresist pattern 179 may be removed by an ashing process and/or a stripping process, among others.

Referring to FIG. 16, the first preliminary gate oxide layer 155 may be partially etched by a wet etching process using an HF diluted solution.

After performing the wet etching process, portions of the first preliminary gate oxide layer 155 having a relatively thick thickness may remain. Thus, portions of the first preliminary gate oxide layer 155 on the side upper surface of the recess 156 and the upper surface of the first region of the semiconductor substrate 150 may remain. In contrast, portions of the first preliminary gate oxide layer 155 on the side lower surface of the recess 156 and the upper surface of the second region of the semiconductor substrate 150 may be completely removed.

Figure 18:
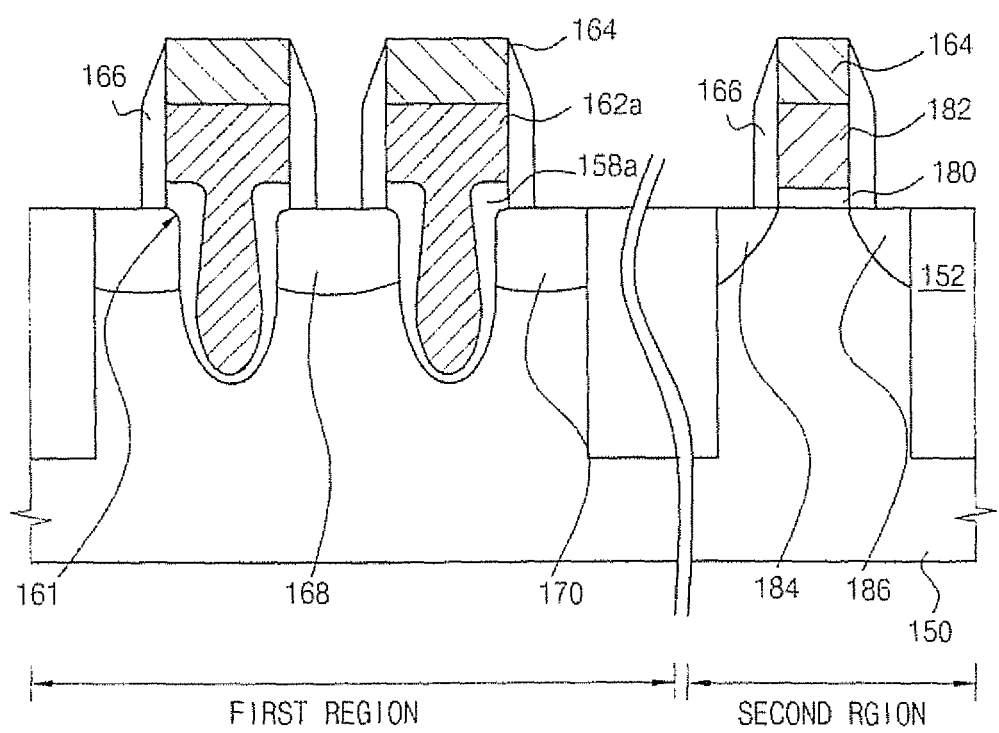
FIG. 18 is a cross-sectional view illustrating a semiconductor device in accordance with some embodiments of the present invention.

Referring to FIG. 18, a thermal oxidation process may be performed on the remaining first preliminary gate oxide layer 155 to form a first gate oxide layer 158 in the first region and a second gate oxide layer 180 in the second region. In some embodiments, the thermal oxidation process may include a dry oxidation process, a wet oxidation process, a clean oxidation process, and/or a radical oxidation process, among others. In some embodiments, the first gate oxide layer 158 and the second gate oxide layer 180 formed by the thermal oxidation process may have a uniform thickness.

Some embodiments provide that the first preliminary gate oxide layer 155 and the oxide layer 158a formed by the thermal oxidation process may be sequentially stacked on the side upper surface of the recess 156. Therefore, an upper portion of the first gate oxide layer 158 on the side upper surface of the recess 156 may have a thickness less than that of a lower portion of the first gate oxide layer 158 on the side lower surface of the recess 156. In some embodiments, the second gate oxide layer 180 may include oxide formed by a thermal oxidation.

Further, the oxide layer in the first region between the source/drain regions and the gate electrode of the recessed channel array transistor may have a relatively thick thickness. Furthermore, the oxide layer on the channel region of the recessed channel array transistor may have a relatively thin thickness.

Processes substantially the same as those illustrated with reference to FIG. 14 may be performed to form a first gate electrode, a second gate electrode, a hard mask pattern, a gate spacer, first source/drain regions and/or second source/drain region, thereby completing the semiconductor device in FIG. 11.

FIG. 18 is a cross-sectional view illustrating a semiconductor device in accordance with some embodiments of the present invention. The semiconductor device of such embodiments may include elements substantially the same as those of the semiconductor device in FIG. 11 except for a thickness of a gate oxide layer. Thus, the same reference numerals refer to the same elements and any further illustrations with respect to the same elements may be omitted herein for brevity.

Referring to FIG. 18, a semiconductor substrate 150 may have a first region and a second region. The semiconductor substrate 150 may include single crystalline silicon. The first region may correspond to a memory cell region. The second region may correspond to a peripheral circuit region.

The recessed channel array transistor in FIG. 3 may be formed on the first region of the semiconductor substrate 150. A planar transistor may be formed on the second region of the semiconductor substrate 150.

In some embodiments, a second gate oxide layer 180 of the planar transistor may have a thickness substantially the same as that of a first gate oxide layer 158a of the recessed channel array transistor on the first region of the semiconductor substrate 150. The first gate oxide layer 158a and the second gate oxide layer 180 may be formed by substantially the same plasma oxidation process.

A first gate electrode 162a and a hard mask pattern 164 may be sequentially formed on the first gate oxide layer 158a. A second gate electrode 182 and the hard mask pattern 164 may be sequentially formed on the second gate oxide layer 180. Spacers 166 may be formed on sidewalls of the first gate electrode 162a and the second gate electrode 182, respectively.

First source/drain regions 168 and 170 may be formed in the semiconductor substrate 150 at both sides of the first gate electrode 162a. Second source/drain regions 184 and 186 may be formed in the semiconductor substrate 150 at both sides of the second gate electrode 182.

According to some embodiments, the first gate oxide layer of the recessed channel array transistor in the first region may have the thickness substantially the same as that of the second gate oxide layer of the planar transistor in the second region. Further, the first gate oxide layer and the second oxide layer may be formed by the single oxidation process. Thus, the semiconductor device may be manufactured by the simple processes.

Figure 19:
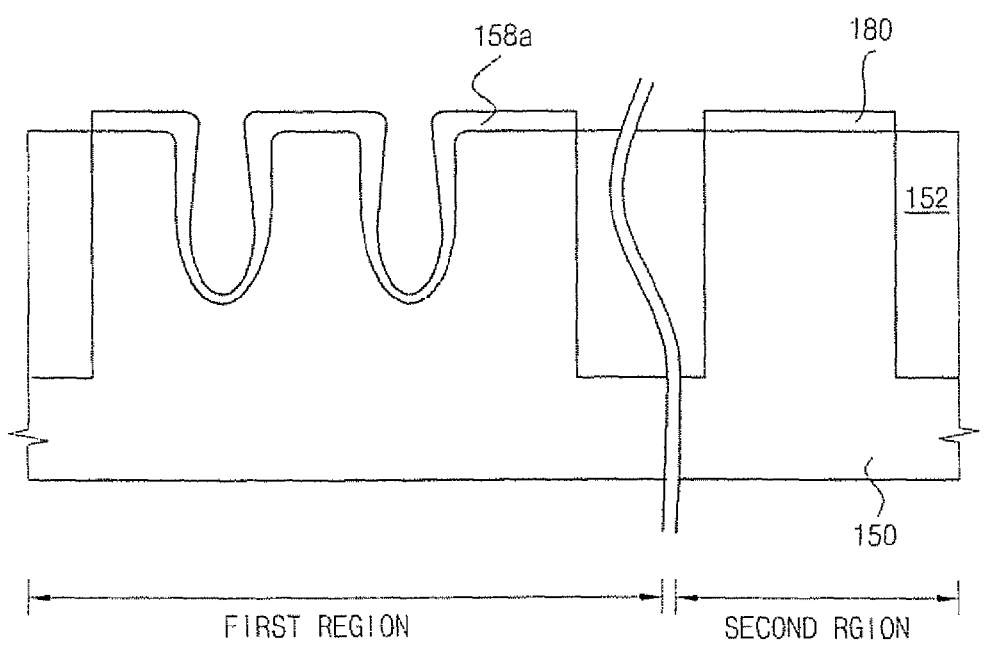
FIG. 19 is a cross-sectional view illustrating methods of manufacturing the semiconductor device in FIG. 18.

FIG. 19 is a cross-sectional view illustrating methods of manufacturing the semiconductor device in FIG. 18. An isolation layer pattern 152 may be formed in a semiconductor substrate 150 having a first region and a second region to define an active region and an isolation region of the semiconductor substrate 150. The active region in the first region may have an isolated island shape. The isolation layer pattern 152 may be configured to surround the active region.

The first region of the semiconductor substrate 150 may be partially etched to form a recess 156. Here, the process for forming the recess 156 may be substantially the same as that illustrated with reference to FIG. 6.

A plasma oxidation process may be performed on the upper surface of the semiconductor substrate 150 and the inner surface of the recess 156 to form a first gate oxide layer 158a in the first region and a second gate oxide layer 180 in the second region. In some embodiments, the first gate oxide layer 158a and the second gate oxide layer 180 may be formed by the single oxidation process. The first gate oxide layer 158a may have a shape substantially the same as that described above and illustrated with reference to FIGS. 7 to 9.

Processes substantially the same as those illustrated with reference to FIG. 14 may be performed to complete the semiconductor device in FIG. 18.

According to some embodiments, methods may not require a process for removing the oxide layer to form the gate oxide layer of the planar transistor. Thus, the semiconductor device may be manufactured using simple processes.

Figure 20:
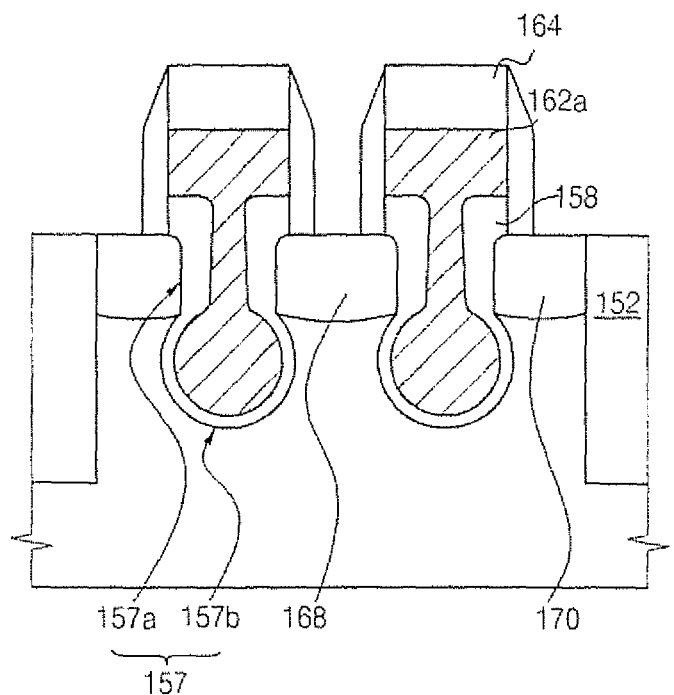
FIG. 20 is a cross-sectional view illustrating a recessed channel array transistor in accordance with some embodiments of the present invention.

FIG. 20 is a cross-sectional view illustrating a recessed channel array transistor in accordance with some embodiments of the present invention. The recessed channel array transistor of such embodiments may include elements substantially the same as those of the recessed channel array transistor in FIG. 3 except for a recess. Thus, the same reference numerals refer to the same elements and any further illustrations with respect to the same element are omitted herein for brevity.

Referring to FIG. 20, a semiconductor substrate 150 may be prepared. In some example embodiments, the semiconductor substrate 150 may include single crystalline silicon. An isolation layer pattern 152 may be formed in the semiconductor substrate 150. The isolation layer pattern 152 may define an active region 150a and an isolation region of the semiconductor substrate 150. The active region 150a may have an isolated island shape. The isolation layer pattern 152 may be configured to surround the active region 150a.

A recess 157 may be formed at an upper surface of the semiconductor substrate 150 in the active region 150a. In some embodiments, the recess 157 may have a shape crossing over the active region 150a. Thus, the recess 157 may have a first side surface, a second side surface, a third side surface and a fourth side surface. The first side surface may confront the second side surface. The third side surface may confront the fourth side surface. Therefore, the first side surface and the second side surface may be substantially perpendicular to the third side surface and the fourth side surface. The semiconductor substrate 150 may be exposed through the first side surface and the second side surface. Further, the isolation layer pattern 152 may be exposed through the third side surface and the fourth side surface.

The recess 157 may have an upper portion 157a and a lower portion 157b in fluidic communication with the upper portion 157a. The upper portion 157a may have a first width. The lower portion 157b may have a second width greater than the first width. The second portion 157b may have a semi-spherical shape.

An intersection between a side edge of the recess 157 and a sidewall of the active region 150a may have a rounded shape without a sharp end and/or a smooth sharp end. An intersection between an upper end of the recess 157 and an upper surface of the semiconductor substrate 150 may have a rounded shape.

A gate oxide layer 158 may be formed on the upper surface of the semiconductor substrate 150 and the side surface of the recess 157. In some embodiments, the gate oxide layer 158 may have a gradually decreased thickness from the upper portion 157a to the lower portion 157b. That is, an upper portion of the gate oxide layer 158 in the upper portion 157a of the recess 157 may have a thickness greater than that of a lower portion of the gate oxide layer 158 in the lower portion 157b of the recess 157. The lower portion of the gate oxide layer 158 in the lower portion 157b of the recess 157 may have a uniform thickness. A portion of the gate oxide layer 158 on the intersection between the side edge of the recess 157 and the sidewall of the active region 150a may have a thickness greater than about 70% of a thickness of a portion of the gate oxide layer 158 on the side surface of the recess 157.

In some embodiments, the gate oxide layer 158 may be formed by a plasma oxidation process.

A gate electrode 162a may be formed on the gate oxide layer 158 to fill up the recess 157. A spacer 166 may be formed on a sidewall of the gate electrode 162a. Source/drain regions 168 and 170 may be formed in the semiconductor substrate 150 at both sides of the gate electrode 162a.

Figure 21:
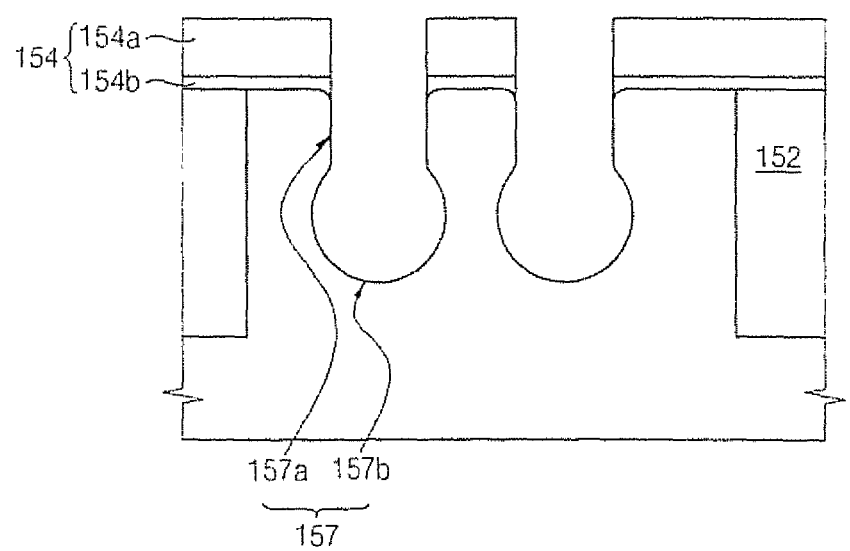
FIG. 21 is a cross-sectional view illustrating methods of forming the recessed channel array transistor in FIG. 20.

FIG. 21 is a cross-sectional view illustrating methods of forming the recessed channel array transistor in FIG. 20. Methods according to such embodiments may include processes substantially the same as those illustrated with reference to FIGS. 6 to 10 except for a process for forming a recess. Thus, any further illustrations with respect to the same processes are omitted herein for brevity.

Referring to FIG. 21, a shallow trench isolation process may be performed on a semiconductor substrate 150 to form an isolation layer pattern 152 configured to define an active region and an isolation region of the semiconductor substrate 150. In some embodiments, the active region may have an isolated island shape. The isolation layer pattern 152 may be configured to surround the active region.

A mask pattern 154 may be formed on the active region of the semiconductor substrate 150 and the isolation layer pattern 152 to expose a region of the semiconductor substrate 150 where a recess may be formed. In some embodiments, the mask pattern 154 may include a pad oxide layer pattern 154a and a silicon nitride layer pattern 154b formed on the pad oxide layer pattern 154a. The region of the semiconductor substrate 150 exposed through the mask pattern 154 may have a linear shape crossing over the active region.

The active region of the semiconductor substrate 150 may be anisotropically etched using the mask pattern 154 as an etch mask to form an upper recess 157a. In some embodiments, the upper recess 157a may be formed by a reactive ion etching process using an etching gas including chlorine. A cleaning process may be additionally performed to remove byproducts generated in the reactive ion etching process.

A protecting layer (not shown) may be formed on an inner surface of the upper recess 157a and mask pattern 154. In some embodiments, the protecting layer may include a material having an etching selectivity with respect to the semiconductor substrate 150. Examples of the protecting layer may include silicon oxide, and/or silicon nitride, among others. The protecting layer may be etched-back to form a protecting layer patter (not shown) configured to cover the side surface of the upper recess 157a.

The semiconductor substrate 150 exposed through the upper recess 157a may be etched using the protecting layer pattern as an etch mask to form a lower recess 157b in fluidic communication with the upper recess 157a. In some embodiments, the lower recess 157b may be formed by an isotropic etching process. For example, the isotropic etching process may use an etching gas including $SF_6$, $Cl_2$, and/or $O_2$, among others.

The lower recess 157b may have a second width greater than a first width of the upper recess 157a. The lower recess 157b may have a semi-spherical shape.

The isolation layer pattern 152 may be exposed through the third surface and the fourth surface of the recess 157.

The mask pattern 154 may then be removed. Processes substantially the same as those illustrated with reference to FIGS. 7 to 10 may be performed to complete the recessed channel array transistor in FIG. 20.

Figure 22:
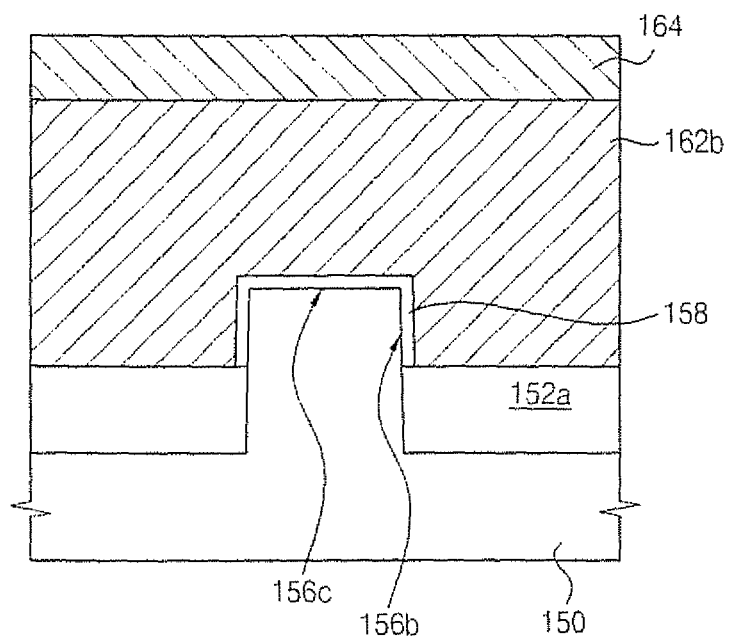
FIG. 22 is a cross-sectional view illustrating a recessed channel array transistor in accordance with some embodiments of the present invention
Figure 23:
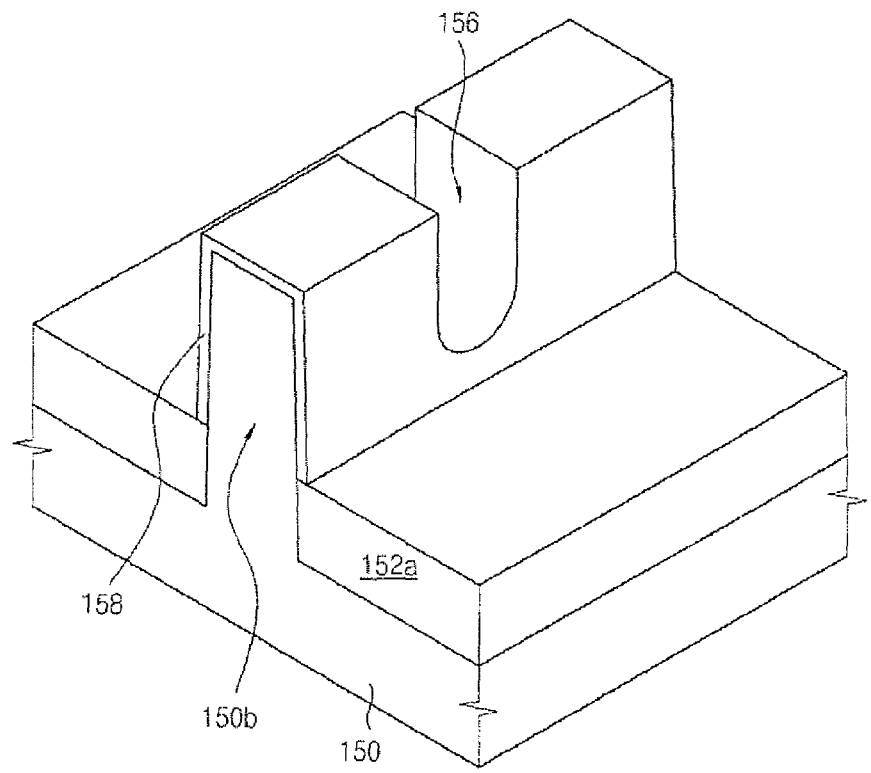
FIG. 23 is a perspective view illustrating an active pin and a gate insulating layer in the recessed channel transistor in FIG. 22.

FIG. 22 is a cross-sectional view illustrating a recessed channel array transistor in accordance with some embodiments of the present invention. FIG. 23 is a perspective view illustrating an active pin and a gate insulating layer in the recessed channel transistor in FIG. 22.

Here, the recessed channel array transistor of such embodiments may include a saddle-FinFET having a channel at an upper surface and a sidewall of an active region.

Further, the recessed channel array transistor of some embodiments may have a cross section in an extending direction of the active region substantially the same as that of the recessed channel array transistor in FIG. 3. In contrast, the recessed channel array transistor of some embodiments may have a cross section in an extending direction of a gate electrode different from that of the recessed channel array transistor in FIG. 3. Thus, any further illustrations with respect to the same cross section are omitted herein for brevity.

Referring to FIGS. 22 and 23, an active fin 150b and an isolation layer pattern 152a may be formed in the semiconductor substrate 150 including single crystalline silicon. A recess 156 may be formed in the active fin 150b.

In some embodiments, the isolation layer pattern 152a may have an upper surface lower than a bottom surface 156c of the recess 156. The upper surface of the isolation layer pattern 152a may be even. In this case, the entire upper surface of the isolation layer pattern 152a may be lower than the bottom surface 156c of the recess 156.

In some embodiments, although not depicted in drawings, the upper surface of the isolation layer pattern 152a may have a high stepped portion and a low stepped portion. Particularly, a portion of the isolation layer pattern 152a adjacent to the recess 156 may have the low stepped portion. In contrast, the rest portion of the isolation layer pattern 152a may have the high stepped portion. In this case, an upper surface of the portion of the isolation layer pattern 152a adjacent to the recess 156 may be lower than the bottom surface 156c of the recess 156. Thus, a sidewall of the active fin 150b may be exposed between tyre bottom surface 156c of the recess 156 and the upper surface of the isolation layer pattern 152a. The rest portion of the isolation layer pattern 152a may have an upper surface higher than the bottom surface 156c of the recess 156. Further, the rest portion of the isolation layer pattern 152a may have a lower surface lower than the bottom surface 156c of the recess 156. Therefore, an outer wall 156b of the active fin 150b may be partially protruded from the isolation layer pattern 152a.

A gate oxide layer 158 may be formed on the upper surface of the semiconductor substrate 150 and the inner surface of the recess 156. Here, the gate oxide layer 158 may have a shape substantially the same as that of the gate oxide layer illustrated with reference to FIGS. 7 to 9.

A gate electrode 162b may be formed on the gate oxide layer 158 to fill up the recess 156. The gate electrode 162b may be partially protruded from the upper surface of the semiconductor substrate 150. Although not depicted in drawings, the gate electrode 162b may have a linear shape crossing over the active fin 150b.

A hard mask, a spacer and/or source/drain regions of the recessed channel array transistor in accordance with some embodiments may be substantially the same as those of the recessed channel array transistor in FIG. 3, respectively.

According to some embodiments, the recessed channel array transistor may include the saddle-FinFET, so that the recessed channel array transistor may have a long effective channel length. As a result, the recessed channel array transistor may have a low of the current.

Figure 24:
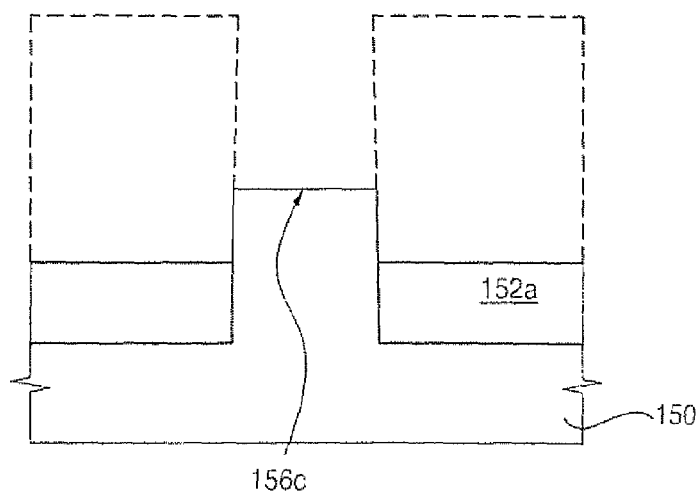
FIG. 24 is a cross-sectional view illustrating a method of forming the recessed channel array transistor in FIG. 22.

FIG. 24 is a cross-sectional view illustrating methods of forming the recessed channel array transistor in FIG. 22.

Here, the methods of some embodiments may include processes substantially the same as those for forming the recessed channel array transistor in FIG. 3 except for including an addition process for removing an isolation layer pattern after forming a recess. Thus, any further illustrations with respect to the same processes are omitted herein for brevity.

Processes substantially the same as those described above and illustrated with reference to FIG. 6 may be performed to a preliminary isolation layer pattern and a recess.

Referring to FIGS. 23 and 24, the preliminary isolation layer pattern may be partially etched to form an isolation layer pattern 152a having an upper surface lower than the recess.

In some embodiments, the entire upper surface of the preliminary isolation layer pattern may be etched to form the isolation layer pattern 152a having a flat upper surface. Some embodiments provide that a portion of the preliminary isolation layer pattern adjacent to the recess may be selectively etched to form the isolation layer pattern 152a having a stepped portion. The stepped portion of the isolation layer pattern 152a may have an upper surface lower than the recess.

Processes substantially the same as those described above and illustrated with reference to FIGS. 7 to 10 may be performed to complete the recessed channel array transistor in FIG. 22.

Figure 25:
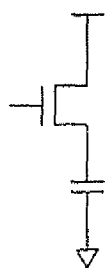
FIG. 25 is a circuit diagram illustrating a DRAM device in accordance with some embodiments of the present invention.

FIG. 25 is a circuit diagram illustrating a DRAM device in accordance with some embodiments of the present invention. A DRAM device of some embodiments may include a MOS transistor and a capacitor. The MOS transistor may include the recessed channel array transistor of some embodiments. Further, although not depicted in drawings, the MOS transistor in a peripheral circuit of the DRAM device may include the planar transistor of some embodiments as described herein.

Figure 26:
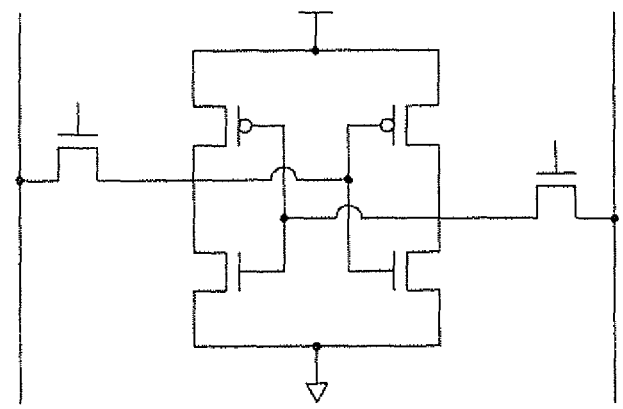
FIG. 26 is a circuit diagram illustrating an SRAM device in accordance with some embodiments of the present invention.

FIG. 26 is a circuit diagram illustrating an SRAM device in accordance with some embodiments of the present invention. An SRAM device of some embodiments may include an NMOS transistor and a PMOS transistor. The NMOS transistor and the PMOS transistor may include the recessed channel array transistor of some embodiments as described herein.

Figure 27:
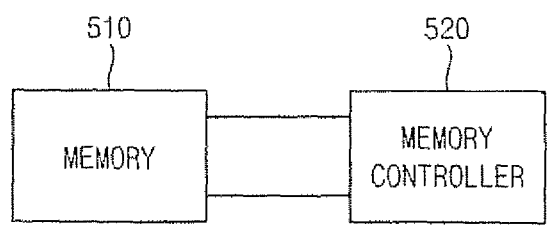
FIG. 27 is a block diagram illustrating a memory system in accordance with some embodiments of the present invention.

FIG. 27 is a block diagram illustrating a memory system in accordance with some embodiments of the present invention. A memory system of some embodiments may include a memory controller 520 and a memory 510. The memory 510 may include the recessed channel array transistor of some embodiments as described herein. The planar transistor of some embodiments may be formed in a peripheral region of the memory 510.

The memory controller 520 may input a signal into the memory 510 to control operations of the memory 510. In some embodiments, the signal may include a command signal, an address signal, and/or an input/output signal, among others. The memory controller 520 may control data in the DRAM device in accordance with the signal.

Figure 28:
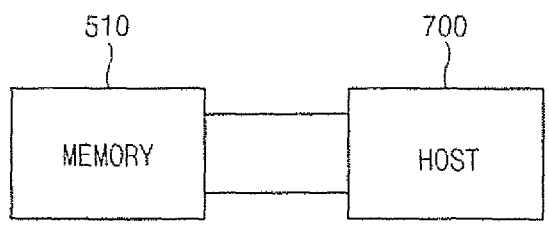
FIG. 28 is a block diagram illustrating a host system in accordance with some embodiments of the present invention.

FIG. 28 is a block diagram illustrating a host system in accordance with some embodiments of the present invention. Some embodiments provide that a host system 700 of some embodiments may be connected to a memory 510. The memory 510 may include the recessed channel array transistor of some embodiments as described herein. The planar transistor may be formed in a peripheral region of the memory 510.

In some embodiments, the host system 700 may include an electronic device such as a personal computer, a camera, a mobile device, a game device, and/or a communication device, among others. The host system 700 may apply a signal, which may be used for control and operate the memory 510, to the memory 510.

Figure 29:
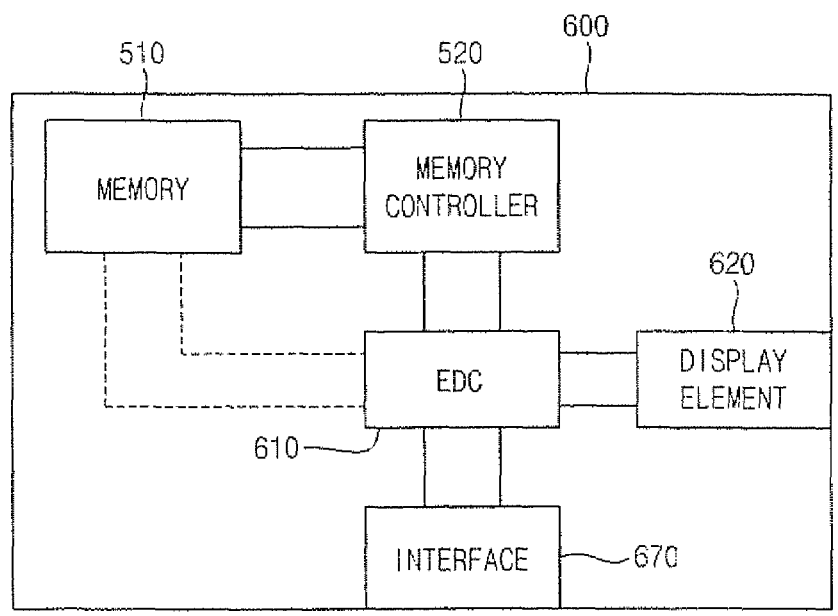
FIG. 29 is a block diagram illustrating a portable device in accordance with some embodiments of the present invention.

FIG. 29 is a block diagram illustrating a portable device in accordance with some embodiments of the present invention. Some embodiments provide that a portable device 600 may include an MP3 player, and/or a video player, among others. The portable device 600 may include a memory 510 and/or a memory controller 520. The memory 510 may include the recessed channel array transistor of some embodiments as described herein. The planar transistor of some embodiments may be formed in a peripheral region of the memory 510.

In some embodiments, the portable device 600 may also include an encoder/decoder 610, a display 620 and an interface 670. Data may be input/output into/from the memory 510 through the memory controller 520 by the encoder/decoder 620.

Figure 30:
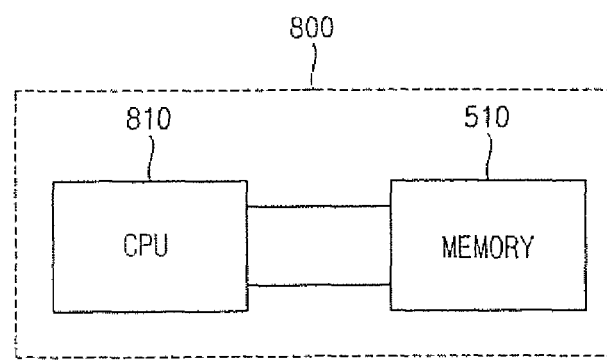
FIG. 30 is a block diagram illustrating a computer system in accordance with some embodiments of the present invention.

FIG. 30 is a block diagram illustrating a computer system in accordance with some embodiments of the present invention. Some embodiments provide that the memory 510 may be connected with a central processing unit (CPU) 810 of a computer system 800. In some embodiments, the computer system 800 may include a personal computer, and/or a personal data assistant device, among others. The memory 510 may be connected to the CPU 810 directly and/or indirectly via a bus. The memory 510 may include the recessed channel array transistor of some embodiments as described herein. The planar transistor may be formed in the peripheral region of the memory 510. Although not depicted in drawings, other elements may be constituted in the computer system 800.

Here, the recessed channel array transistors of these exemplary embodiments may have a three-dimensional structure. For example, the gate oxide layer may be used in a recessed channel array transistor, a saddle transistor, a saddle fin transistor, and/or a recessed fin transistor, among others.

Comparative Experiment 1

Manufacturing a Sample 1

A sample 1 was manufactured by the processes illustrated with reference to FIGS. 6 to 10. A recess was formed at an upper surface of a semiconductor substrate. An oxide layer was formed on an inner surface of the recess by a plasma oxidation process. The recess had an upper recess having a first width and a lower recess having a second width greater than the first width. The lower recess had a semi-spherical shape. The recess had a shape substantially the same as that of the recess in FIG. 20. The plasma oxidation process was performed at a temperature of about 500° C. under a pressure of about 5 Torr. An oxidizing agent including oxygen and hydrogen was used in the plasma oxidation process. A plasma source gas including argon was used in the plasma oxidation process.

Manufacturing a Sample 2

A sample 2 was manufactured by processes substantially the same as those for manufacturing the sample 1 except for the plasma oxidation pressure. A plasma oxidation process was performed under a pressure of about 1 Torr.

Manufacturing a Sample 3

A sample 3 was manufactured by processes substantially the same as those for manufacturing the sample 1 except for the plasma oxidation pressure. A plasma oxidation process was performed under a pressure of about 0.7 Torr.

Manufacturing a Comparative Sample 1

A comparative sample 1 was manufactured by following processes. A recess was formed at an upper surface of a semiconductor substrate. An oxide layer was formed on an inner surface of the recess by a thermal oxidation process. The thermal oxidation process was performed at a temperature of about 800° C. An oxidizing agent included oxygen and hydrogen. The recess of the comparative sample 1 had a shape substantially the same as that of the sample 1.

Measuring Thicknesses of Oxide Layers

Thicknesses of the oxide layers on the inner surfaces of the recesses in the samples 1 to 3 and comparative sample 1, respectively, were measured. Particularly, thicknesses of first oxide layers in the upper recess were measured. Thicknesses of second oxide layers in the lower recess were measured. The thicknesses of the oxide layers in the upper recess were measured at a portion of the upper recess adjacent to a boundary between the upper recess and the lower recess. Measured thicknesses are illustrated in the following Table 1.

TABLE 1

| | Thickness of first oxide layer (Å) | Thickness of second oxide layer (Å) | Thickness ratio (first oxide layer:second oxide layer) |
|---|---|---|---|
| Comparative sample 1 | 65 | 60 | 1.08:1 |
| Sample 1 | 69 | 45 | 1.53:1 |
| Sample 2 | 63 | 45 | 1.40:1 |
| Sample 3 | 60 | 30 | 2.00:1 |

In Table 1, thickness differences between the first oxide layer and the second oxide layer in the samples 1 to 3 may be greater than that in the comparative sample 1. Thus, it can be noted that the oxide layer having different thicknesses by a depth of the recess may be formed by the example embodiments.

Comparative Experiment 2

Manufacturing a Sample 4

DRAM chips including the recessed channel array transistor in FIG. 3 were manufactured. Particularly, a recess was formed at a semiconductor substrate. A plasma oxidation process was performed on the semiconductor substrate to form a gate oxide layer on an inner surface of the recess. The DRAM chips were mounted on 15 wafers, respectively.

Manufacturing a Comparative Sample 2

DRAM chips including a conventional recessed channel array transistor were manufactured. Particularly, a recess was formed at a semiconductor substrate. A thermal oxidation process was performed on the semiconductor substrate to form a gate oxide layer on an inner surface of the recess. The DRAM chips were mounted on 12 wafers.

Measuring Failbits in Wafers

Refresh characteristics of the sample 4 and the comparative sample 2 were measured. Failbits of DRAM chips in the sample 4 and the comparative sample 2 during refreshing operations were measured.

Failbit numbers of the 12 wafers on which the comparative samples 2 were mounted were measured. A failbit average was then obtained from the failbit numbers. The failbit average was set as a reference value 1.

Failbit numbers of the 15 wafers on which the samples 4 were mounted were measured. A failbit average was then obtained from the failbit numbers. The failbit average was converted into a relative value with respect to the reference value 1.

Figure 31:
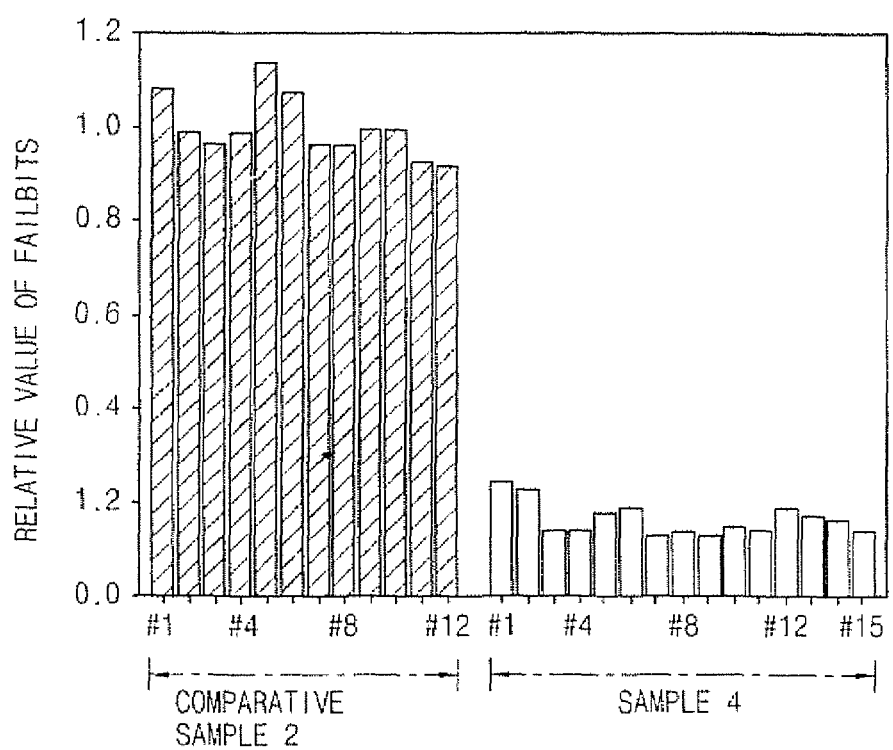
FIG. 31 is a graph showing relative values of failbits in sample wafers.

FIG. 31 is a graph showing relative values of failbits in sample wafers.

As mentioned above, the relative values of the sample 4 may be relative to the reference value 1 of the comparative sample 2.

As shown in FIG. 31, the 12 wafers having the comparative sample 2 may have a relative value of about 0.9 to about 1.15.

In contrast, the 15 wafers having the sample 4 may have a relative value of about 0.1 to about 0.2. Further, when the failbit average of the sample 4 is converted into a relative value with respect to the reference value 1, the relative value may be about 0.16.

Thus, it can be noted that the failbits of the refresh in the DRAM device including the recessed channel array transistor of the example embodiments may be remarkably reduced.

According to the above results, a leakage current of the recessed channel array transistor may be decreased, so that the DRAM device may have improved data retention characteristics. As a result, the DRAM device may have improved refresh characteristics.

According to some embodiments, the recessed channel array transistor may be used for a selection transistor of a semiconductor device having a high integration degree and a high capacity. Particularly, the recessed channel array transistor may be used for a cell transistor of a DRAM.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A recessed channel array transistor comprising:
    a substrate having an active region that includes a recess and an isolation region;
    a gate oxide layer formed on an inner surface of the recess and an upper surface of the substrate, the gate oxide layer including a first portion on an intersection between a side end of the recess and a sidewall of the active region and a second portion on a side surface of the recess and spaced apart from the side end of the recess, the first portion having a thickness greater than 70% of a thickness of the second portion at a same height in plan view;
    a gate electrode formed on the gate oxide layer and in the recess; and
    source/drain regions formed in the upper surface of the substrate at both sides of the gate electrode,
    wherein the gate oxide layer comprises an upper portion on a side upper surface of the recess and a lower portion on a side lower surface of the recess, and wherein the upper portion comprises a thickness that is greater than that of the lower portion,
    wherein the first portion and the second portion are a first distance from a bottom surface of the substrate, and wherein the thickness of the first portion is different from the thickness of the second portion.

2. The recessed channel array transistor of claim 1, wherein the isolation region is positioned at both side ends of the recess in a direction that is substantially perpendicular to an extending direction of the active region.

3. The recessed channel array transistor of claim 1, wherein a corner between a side upper end of the recess and the sidewall of the active region comprises a rounded shape.

4. The recessed channel array transistor of claim 1, wherein the gate oxide layer comprises a gradually decreased thickness from the side upper surface of the recess to the side lower surface of the recess.

5. The recessed channel array transistor of claim 1, wherein a portion of the gate oxide layer on the side edge surface of the recess comprises a thickness greater than about 70% of a thickness of a portion of the gate oxide layer on a side central surface of the recess.

6. The recessed channel array transistor of claim 1, wherein the recess comprises a gradually decreased width in a downward direction.

7. The recessed channel array transistor of claim 1, wherein the gate oxide layer is formed by using a plasma oxidation process.

8. A recessed channel array transistor comprising:
    a substrate having an active region that includes a recess and an isolation region, the recess comprising an upper recess portion having an upper width and a lower recess portion having a lower width that is greater than the upper width;
    a gate oxide layer formed on an inner surface of the upper recess portion having the upper width and the lower recess portion having the lower width and an upper surface of the substrate, the gate oxide layer including a first portion on an intersection between a side end of the recess and a sidewall of the active region and a second portion on a side surface of the recess and spaced apart from the side end of the recess, the first portion having a thickness greater than 70% of a thickness of the second portion at a same height in plan view;
a gate electrode formed on the gate oxide layer and in the recess; and
source/drain regions formed in the upper surface of the substrate at both sides of the gate electrode,
wherein the lower recess portion is contiguous with the upper recess portion, and wherein the thickness of the first portion is different from the thickness of the second portion.

9. The recessed channel array transistor of claim 8, wherein the lower recess portion comprises a semi-spherical shape.

10. A semiconductor device comprising:
a substrate having a first region that has a recess and a second region that has a flat surface;
a first gate oxide layer formed on an inner surface of the recess and an upper surface of the substrate in the first region, the first gate oxide layer including a first portion on an intersection between a side end of the recess and a sidewall of the first region and a second portion on a side surface of the recess and spaced apart from the side end of the recess, the first portion including a thickness greater than 70% of a thickness of the second portion at a same height in plan view;
a second gate oxide layer formed on an upper surface of the substrate in the second region;
a first gate electrode formed in the recess;
first source/drain regions formed in the upper surface of the substrate at both sides of the first gate electrode;
a second gate electrode formed on the second gate oxide layer; and
second source/drain regions formed in the upper surface of the substrate at both sides of the second gate electrode,
wherein the second gate oxide layer comprises a thickness different from that of the first gate oxide layer, and wherein the thickness of the first portion is different from the thickness of the second portion.

11. The semiconductor device of claim 10, wherein the first gate oxide layer comprises a gradually decreased thickness from a side upper surface of the recess to a side lower surface of the recess.

* * * * *